(12) United States Patent
Miyazaki

(10) Patent No.: US 8,171,374 B2
(45) Date of Patent: May 1, 2012

(54) LDPC CHECK MATRIX GENERATION METHOD, CHECK MATRIX GENERATOR, AND CODE RETRANSMISSION METHOD

(75) Inventor: Shunji Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 938 days.

(21) Appl. No.: 12/186,742

(22) Filed: Aug. 6, 2008

(65) Prior Publication Data
US 2008/0301518 A1 Dec. 4, 2008

Related U.S. Application Data

(63) Continuation of application No. PCT/JP2006/302246, filed on Feb. 9, 2006.

(51) Int. Cl.
*G06F 11/00* (2006.01)
(52) U.S. Cl. .................... 714/758; 714/752
(58) Field of Classification Search .................... None
See application file for complete search history.

(56) References Cited

U.S. PATENT DOCUMENTS

| | | | | |
|---|---|---|---|---|
| 7,278,082 | B2 * | 10/2007 | Kim et al. | 714/752 |
| 7,620,873 | B2 * | 11/2009 | Kanaoka et al. | 714/752 |
| 7,900,127 | B2 * | 3/2011 | Shen et al. | 714/804 |
| 8,015,469 | B2 * | 9/2011 | Lim et al. | 714/752 |
| 2004/0268205 | A1 * | 12/2004 | Stolpman | 714/758 |
| 2006/0002484 | A1 | 1/2006 | Miyazaki et al. | |

(Continued)

FOREIGN PATENT DOCUMENTS

JP 2006-19782 1/2006

OTHER PUBLICATIONS

Hui Jin, Aamod Khandekar, and Robert McEliece, "Irregular Repeat-Accumulate Codes," Proceedings 2nd International Symposium on Turbo Codes and Related Topics, Brest, France, Sep. 2000, pp. 1-8.

(Continued)

*Primary Examiner* — Christopher McCarthy
(74) *Attorney, Agent, or Firm* — Myers Wolin, LLC

(57) ABSTRACT

A check matrix generation method for generating a check matrix H1 of a code H1 from a check matrix H0 of a code C0, where codes C0 and C1 are LDPC systematic codes having different encoding ratios in a rate-compatible relationship and information bit sizes of the systematic codes C0 and C1 are K, and parity bit sizes thereof are M0 and M1 (M1−M0=L) respectively. The method comprising steps of: selecting L number of rows out of the check matrix H0; separating an information bit portion and a parity bit portion constituting each of the selected rows into two respectively, such that each of the separated information bit portions includes one or more non-zero elements which are "elements different from 0"; creating a new first row by coupling one separated information bit porting and one separated parity bit portion and creating a new second row by coupling another separated information bit portion and another separated parity portion; and generating the check matrix H1 of the systematic code C1 by placing the new first and second rows in place of each of the selected L number of rows in the check matrix H0.

13 Claims, 22 Drawing Sheets

U.S. PATENT DOCUMENTS

| | | | |
|---|---|---|---|
| 2006/0123314 A1* | 6/2006 | Kim et al. | 714/758 |
| 2007/0162821 A1* | 7/2007 | Hwang et al. | 714/758 |
| 2007/0186140 A1* | 8/2007 | Senda | 714/758 |
| 2008/0005641 A1* | 1/2008 | Uchikawa et al. | 714/758 |
| 2009/0164863 A1* | 6/2009 | Oh et al. | 714/752 |
| 2009/0228767 A1* | 9/2009 | Oh et al. | 714/781 |
| 2009/0235144 A1* | 9/2009 | Senda | 714/758 |
| 2010/0050045 A1* | 2/2010 | Chung et al. | 714/752 |
| 2010/0153819 A1* | 6/2010 | Ueng et al. | 714/763 |
| 2010/0211857 A1* | 8/2010 | Kobayashi | 714/784 |
| 2010/0299572 A1* | 11/2010 | Yokokawa et al. | 714/752 |
| 2011/0022922 A1* | 1/2011 | Sharon et al. | 714/752 |
| 2011/0099448 A1* | 4/2011 | Mohsenin et al. | 714/752 |

OTHER PUBLICATIONS

Jing Li and Krishna R. Narayanan, "Rate Compatible Low Density Parity Check Codes for Capacity-Approaching ARQ Schemes in Packet Data Communications," Proceeding of International Conference on Communications, Internet and Information Technology (CIIT), US Virgin Islands, Nov. 2002, pp. 201-206.

Chingfu Lan, Krishna R. Narayanan, and Zixiang Xiong, "Scalable Image Transmission Using Rate-Compatible Irregular Repeat Accumulate (IRA) Codes," 2002 International Conference on Image Processing, vol. 3, Jun. 2002, pp. 717-720.

International Search Report, PCT/JP2006/302246, Apr. 18, 2006.

* cited by examiner

FIG. 17 PRIOR ART $$H = \begin{bmatrix} 1 & 0 & 0 & 0 \\ 1 & 0 & 0 & 1 \\ 1 & 0 & 1 & 1 \\ 0 & 1 & 0 & 0 \\ \vdots & 1 & 1 & 0 \\ \vdots & 1 & 0 & 1 \\ \vdots & 0 & 1 & 0 \\ \vdots & \vdots & 0 & 0 \\ \vdots & \vdots & \vdots & \vdots \\ 0 & 0 & 0 & 0 \end{bmatrix}$$

with width N and height M(=N−K)

H1: INFORMATION BIT PORTION
H2: PARITY BIT PORTION

H1: INFORMATION BIT PORTION
H2: PARITY BIT PORTION

LDPC CHECK MATRIX GENERATION METHOD, CHECK MATRIX GENERATOR, AND CODE RETRANSMISSION METHOD

CROSS REFERENCE TO RELATED APPLICATION

This application is continuation of PCT Application no. PCT/JP2006/302246 filed on Feb. 9, 2006, pending the entire contents of which are incorporated herein by reference.

BACKGROUND OF THE INVENTION

The present invention relates to an LDPC check matrix generation method, check matrix generator, and code retransmission method, and more particularly to an LDPC check matrix generation method, check matrix generator and code retransmission method, by which when two LDPC systematic codes having different encoding ratio in a rate-compatible relationship are C0 and C1, and the information bit sizes of the codes C0 and C1 are both K, and the parity bit sizes thereof are M0 and M1 (M0<M1) respectively, the check matrix H1 or H0 of one code, C1 or C0, is generated from the check matrix H0 or H1 of the other code C0 or C1.

Systematic Code and Block Code

In general, encoding using an information alphabets having q number of different values (q=2 in a case of bits) is performed, as shown tin FIG. 13, by making a block $I_1$ having K number of information alphabets, correspond with a block $I_2$ having N number (N>K) of code alphabets (code bits) on a one-to-one basis. Hereafter the term "bit" is used instead of "alphabet".

In this case, a code, when K bits out of N number of bits of the block $I_2$ are constituted by the information bits of the block $I_1$, is called a "systematic code". The remaining M=N−K bits are called "parity bits", and are acquired by performing a predetermined processing, such as addition, on the information bits.

In other words, a code, when K bits out of the N bits which constitutes the code are the information bits, and the remaining M (=N−K) bits are the parity bits for error detection and correction, is called a "block code", and a block code, when the first K bits of the code are the information bits and (N−K) bits of the parity bits comes after these K bits, is called a "systematic code".

At the transmission side, if N number of code bits $$x=(x_0, x_1, \ldots, x_{N-1})$$

are generated by the following expression $$x=uG \qquad (a)$$

using the K×N generator matrix $$G=(gij); i=0, \ldots, K-1; j=0, \ldots, N-1$$

for the K number of information bits $u=(u_0, u_1, \ldots, u_{K-1})$, then these code bits become block code, and the information bits u are block-encoded. If x is a systematic code, for example, then the generator matrix G can be expressed mathematically, as shown in FIG. 14.

At the reception side, the information bits u are estimated from the code vector x, which is the received data. For this, the information bits u are estimated so as to satisfy the following parity check relational expression $$xH^T=0 \qquad (b)$$

with respect to x.

Here $$H=(hij); i=0, \ldots, M-1; j=0, \ldots, N-1$$

is a parity check matrix, where $H^T$ is a transposition of H (replacement of row and column), and H and G satisfy the following relationship based on (a) and (b).

$$GH^T=0 \qquad (c)$$

This means that an encoding rule is uniquely determined if either H or G is provided. For example, if x is a systematic code and the generator matrix G is a matrix shown in FIG. 14, then the parity check matrix H can be expressed as shown in FIG. 15.

FIG. 16 is a block diagram depicting a communication system where block encoding is performed in a transmitter and the data is decoded in a receiver, and the transmitter 1 comprises an encoding unit 1a for encoding K bits of information u and generating N bits of block codes x, and a modulation unit 1b for modulating the block codes and transmitting the result. The receiver 2 comprises a demodulation unit 2a for demodulating the signal received via a transmission line 3, and a decoding unit 2b for decoding the originally transmitted K bits of information u from the N bits of received information.

The encoding unit 1a has a parity generator 1c for generating M (=N−K) number of parity bits p and a P/S conversion unit 1d for combining K bits of information u and M bits of parity bits p, and outputting N (=K+M) number of block codes x. Mathematically the encoding unit 1a outputs a block code x according to Expression (a). The decoding unit 2b has a decoder 2c for performing error detection correction processing on the received likelihood data y, and decoding the originally transmitted K bits of information, and outputting the estimated information. The block code x sent from the transmitter 1 is not input to the decoder 2c in a state immediately after being transmitted and influenced by the transmission line 3, but is input to the decoder 2c as likelihood data. The likelihood data is comprised of a reliability indicating whether a code bit is 0 or 1, and a sign (0 if level is +1, and 1 if level is −1). The decoder 2c performs a predetermined decoding processing based on the likelihood data for each code bit using the parity check relational expression in Expression (b), and estimates the information bits u.

LDPC Code

LDPC code (Low-Density Parity-Check code) is a generic term for codes defined by a check matrix H, where the ratio of the number of elements which are not 0 in the block code (number of is if q=2) to the total number of elements is low.

In particular, the code, when the number of elements which is not 0 (number of is) is constant in the rows and columns of the check matrix H respectively is called a "regular LDPC code", and is characterized by the code length N, and the weight numbers ($w_c$, $w_r$) which are the number of elements of a column and row respectively. A type of code which allows different weight numbers in each column and each row of the check matrix H is called an "irregular LDPC code", and is characterized by the code length N and the weight number distribution of a column and row (($\lambda_j$, $\rho_k$); j=1, \ldots, $j_{max}$; k=1, \ldots, $k_{max}$). Here $\lambda_j$ indicates a ratio of the number of elements that are different from 0 (number of 1s) and that belong to all the columns of which weight number is j to the entire number of elements that are different from 0. FIG. 17 is a diagram depicting the weight number distribution, and if the number of columns where the number of 1s is j is $N_j$ in the M×N check matrix H and the total number of is in the check matrix H is E, the weight number distribution $\lambda_j$ is $$\lambda_j = j \times N_j / E,$$

and the ratio $f_j$ of the number of columns where the number of 1s is j to the entire number columns is $$f_j = N_j/N.$$

If j=3 and $N_j$=4, for example, then $\lambda_3$=12/E and fj=4/N. $\rho_k$ indicates the ratio of the number of elements which are different from 0 (number of 1s) and which belong to all the rows of which weight number is k to the entire number of elements which are different from 0 and can be defined in the same way as the case of $\lambda_j$. Regular LDPC code can be regarded as a special case of an irregular LDPC code.

In the LDPC code, a concrete check matrix cannot be uniquely determined by determining only a code length N and weight number distribution. In other words, there are many concrete "1" layout methods (layout method of non-zero elements that are different from "0") that satisfy a predetermined weight number distribution, and each defines a different code. The code error rate characteristic depends on the weight number distribution and the concrete layout of "1s" in the check matrix which satisfies this weight number distribution. The circuit scale, processing time and processing volume of the encoder and decoder are basically influenced only by the weight number distribution.

A general LDPC code is defined by a check matrix which is used for decoding processing, and for the encoding processing, a generator matrix G is determined by the check matrix H, or a parity bit is sequentially determined using a triangular check matrix, and regardless the case a processing time is required.

IRA Code

FIG. 18 is a configuration example of an encoder for generating IRA (Irregular Repeat Accumulate) code, which is a kind of irregular LDPC code. A bit repeat unit 5a repeats each bit $u_0$ to $u_{K-1}$ of information bits u for a predetermined number of times to generate and output an bit string consisted of E number of bits. The number of times of repeat of each bit may be different, and this is provided by a distribution function fi.

An interleaver 5b rearranges the sequence of the bit string consisted of E number of bits by interleave processing, and a first operation unit 5c repeats the addition of a number of bits from the head of the bit string acquired by the interleave processing, and inputs the each addition result to a second operation unit 5d. In other words, if the output of the interleave is $e_{01}, e_{02}, e_{03}, \ldots e_{0a}$ $e_{11}, e_{12}, e_{13}, \ldots e_{1a}$ $e_{21}, e_{22}, e_{23}, \ldots e_{2a}$ $\ldots$ $e_{M-1,1}, e_{M-1,2}, \ldots e_{M-1,a}$ and each addition result of "a" number of bits is regarded as a bit vector $x_i$, the first operation unit 5c performs the following calculation, $x_0 = e_{01} + e_{02} + e_{03} + \ldots + e_{0a}$ $x_1 = e_{11} + e_{12} + e_{13} + \ldots + e_{1a}$ $x_2 = e_{21} + e_{22} + e_{23} + \ldots + e_{2a}$ $\ldots$ $x_{M-1} = e_{M-1,1} + e_{M-1,2} + \ldots + e_{M-1,a}$ and outputs the addition result. In the first operation unit 5c, ADD is an adder and DL is a delay unit which input the addition result to the adder, and also outputs the result to the second operation unit 5d at each "a" times of addition.

The second operation unit 5d adds the previous addition result $x_{i-1}$ and addition result $x_i$ of this time, which are output from the first operation unit, and outputs the addition result each time as a result a code bit string consisted of M number of parity bits is output. In the second operation unit 5d, ADD is an adder and DL2 is a one clock time delay unit. If the code bit vector, which is output from the second operation unit 5d, is $p = (p_0, p_1, p_2, \ldots, p_{M-1})$, then the following relational expression is established.

$p_0 = x_0$ $$p_i = p_{i-1} + x_i, i = 1, \ldots, M-1 \quad (1)$$

The IRA code consisted of $c_0$ to $c_{N-1}$ is created by arraying M number of code bits $p_0$ to $p_{M-1}$ which are regarded as M number of parity bits, in serial after the information bits $u_0$ to $u_{K-1}$. The IRA code C is a kind of irregular LDPC codes and is expressed by the following expression.

$$c = (c_0, \ldots, c_{N-1}) = (u_0, \ldots, u_{K-1}, p_0, \ldots, p_{M-1}) \quad (2)$$

The IRA codes specified by the check matrix H (see FIG. 19) can be interpreted as a code that is improved so that the encoding processing time completes in a linear time which is proportion to the code length (see document 1: H. Jin, A. Khandekar and R. McEliece: "Irregular Repeat-Accumulate Codes," Proceedings of 2nd International Sym. on Turbo Codes and Related Topics, Brest, France, pp. 1-8, September 2000).

In other words, considering that a value of each variable is a binary, that is, considering that the addition of the same bit becomes zero (ex. 1+1=0, 0+0=0), the above mentioned Expression (1) can be transformed into the following expression.

$p_0 + x_0 = 0$ $$p_i + p_{i-1} + x_i = 0, i = 1, \ldots, M-1 \quad (3)$$

Each $x_i$ is a result of adding a number of input information bits $u_j$, so if this is substituted in Expression (3), then Expression (3) can be interpreted as a parity check relationship expression for the IRA code $c = (c_0, c_1, \ldots c_{N-1})$.

FIG. 19 is a check matrix H of the IRA code obtained by the parity check relational expression in Expression (3), and if N=K+M, this check matrix H is a M×N matrix comprised of M×K information bit portion H1 and M×M parity bit portion H2. The number of is (weight number) included in each row of the information bit portion H1 is a number of times of additions "a" in the first operation unit 5c, and the distribution of is depends on the number of times of repeats of each bit in the bit repeat unit 5a. In other words, a number of is in the first column is a number of repeats of the information bit $u_0$ in the bit repeat unit 5a, a number of 1s in the second column is a number of repeats of the information bits $u_1$ in the bit repeat unit 5a ..., and a number of 1s in the Kth column is a number of repeats of the information bit $u_{K-1}$ in the bit repeat unit 5a, and the distribution is determined by interleave.

If the check matrix H of the IRA code is provided where the code bit is expressed by c, then the parity check relational expression is given by the following expression.

$cH = 0$

If Expression (2) is substituted in this expression, the parity bit $p_0$ can be determined, and then $p_1 (= p_0 + x_1)$ can be determined using this parity bit $p_0$, and then $p_{i+1} (= p_i + x_{i+1})$ can be determined using the parity bit $p_i$ in the same way, and $p_{M-1}$ can be finally determined. By combining the determined parity bits $p_0$ to $p_{M-1}$ with the information bits $u_0$ to $u_{K-1}$ in series, the IRA code shown by Expression (2) can be generated. In other words, if the check matrix H of the IRA code is given, the parity bits $p_0$ to $p_{M-1}$ can be determined, and the IRA code, which is an LDPC code, can be generated. Therefore once the check matrix H of the IRA codes is provided, it is not necessary to determine generator matrix G.

Number of Times of Addition "a" and Distribution Function fi

The number of times of addition "a" and the distribution function fi which shows number of times of bit repeat are determined based on characteristics and circuit scale. Here the distribution function fi is a ratio of the number of columns where the number of 1s is i to the total number of columns, described in the section of the LDPC code, that is Ni/N.

As a method for optimizing the code characteristics when the code length is long, a Density Evolution (DE) method is known (see the document 1). According to the DE method, the value of "a" should be great as the encoding ratio is higher. In particular, if the number of parity bits becomes half, that is if the encoding ratio increases, the characteristics of the code becomes better if the value of "a" doubles, and if the number of parity bits becomes double, that is if the encoding ratio decreases, the characteristics of the code improve if the values of "a" becomes half.

Generalizing IRA Code (Cyclic Matrix Type IRA Code)

As FIG. 20 shows, a parity check matrix is composed using a z×z cyclic matrix P(j). "Ps" in the information bit portion H1 are all different cyclic matrices having a same size (z×z), where a number of times of right shift is j, but j is omitted in FIG. 20. For example, when z=5, the cyclic matrix P(0) of which number of times of right shift is 0 is a unit matrix, and the cyclic matrix P(1) of which number of times of 1-bit right shift is as follows.

$$P(1) = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix} \quad (4)$$

A blank indicates the 0 matrix in z×z, and I of the parity bit portion H2 indicates a z×z unit matrix. The number of cyclic matrices included in the rows and columns of the check matrix H need not be constant, and an optimum number is selected, just like IRA code, depending on the density development method or by simulation.

In the parity bit portion H2, the cyclic matrix P' having the identical shift number is placed at the top and bottom of the first column, and the unit matrix I is placed at appropriate locations, and a first unit matrix I with size z×z is placed in steps in all remaining columns, then a second unit matrix I is placed so that two unit matrices I come next to each other in each column.

The first advantage of constructing the parity check matrix H by the z×z cyclic matrix P(j) is that the matrix can be expressed easily even if the size of the parity check matrix H increases. The size of M of an M×N parity check matrix H is about 1000 in an actual example, but if a cyclic matrix with z=100 is used, the matrix can be expressed by 10 rows. The second advantage is that if the weight number of each row of the check matrix H is W, the parity check matrix H can be constructed by placing W number of cyclic matrices in each row so as not to be in a same arrangement. In the above description, a cyclic matrix of which weight number is 1 is used, but a cyclic matrix with a 2 or higher weight number may be used.

Rate—Compatible Code

As FIG. 21 shows, when a code word of code C0, of which encoding ratio is greater than code C1, is a part of a code word of C1, the codes C0 and C1 are in a rate compatible relationship (rate-compatible codes). For example, a code C1 and a punctured code C0 thereof, or a code C0 and a code C1 by repetition thereof, are in a rate-compatible relationship. The information bit sizes of the codes C0 and C1 are K respectively, and the parity bit sizes are M0 and M1 (M0<M1) respectively.

Rate—Compatible LDPC Code

As a prior art, a rate-compatible LDPC code has been proposed (see document 2: J. Li and K. R. Narayanan: "Rate-Compatible Low Density Parity Check Codes for Capacity-Approaching ARQ Schemes in Packet Data Communications," Proceedings of International Conference on Communications, Internet and Information Technology (CIIT), US Virgin Islands, pp. 201-206, November 2002). FIG. 22 is a diagram depicting a check matrix of a rate-compatible LDPC code.

As (A) of FIG. 22 shows, a check matrix H0 of code C0, which becomes a reference, is created by parameters optimized by the above mentioned DE method. Then as (B) of FIG. 22 shows, the check matrix H1 of code C1 is expanded so that the check matrix H0 of code C0 is included in a part of this check matrix H1. In this case, if IRA code is used, the weight number of 1 must be determined so that the weight distribution of the information bit portion of the check matrix H1 becomes as close as possible to the optimum distribution determined for code C1 by the DE method.

As described in the section of IRA code, if the encoding ratio is decreased by increasing parities, the weight number "a" in the check matrix of IRA code must be a small value. Therefore the weight number of the extended portion is decreased, and for the parity bit portion, a step matrix with weight number 2 is generated based on the IRA code.

Puncturing

When a code C1 of which information length is K and code length is N1 is provided, the encoding ratio of the code C1 is R1=K/N1. If a code of which encoding ratio is greater than R1 is constructed using this code C1, puncturing is performed. In other words, as FIG. 23 shows, the transmitter removes N0 out of N1 number of code bits, and sends the code having a code length N (=N1−N0). Since the removed bit position is known, the receiver performs decoding processing by interpolating data so that each bit has equal probability, and estimates the code C1. In this puncturing, the encoding ratio becomes R=K/N (>R1). The puncturing can be applied to LDPC code.

Repetition

When a code C1, of which information length is K and code length is N1, is provided, and a code of which encoding ratio is smaller than R1 (=K/N1) is constructed using this code C1, repetition is performed. As FIG. 24 shows, in this repetition, the transmitter repeats some bits (not limited to parity) out of N1 number of code bits more than once so as to add the total N0 number of bits, and sends a code having an N (=N1+N0) number of bits. The receiver performs diversity combining for the data of the repeat alphabet (simplest way is a mere addition), and decodes code C1. The repetition can be applied to LDPC code.

Dummy Bit Insertion

The dummy bit insertion method is one method of generating a code with encoding ratio R'<R for a systematic code having N=K+M bits of which encoding ratio is R (=K/N) by adding M number of parity bits to K number of information bits.

According to the dummy bit insertion method, as FIG. 25 shows, the transmitter adds K0 number of dummy bits DB having a known pattern to K number of information bits IB to generate K1=K+K0 number of information bits, and generates a systematic code C1 having N1=K1+M number of bits by generating M number of parity bits PB using the K1 number of information bits. At transmission, the transmitter adds the generated M number of parity bits PB to the K number of information bits after K0 number of dummy bits are removed from the K1 number of information bits, and sends the result as a code. The receiver adds the known dummy bits DB to the received signal for decoding.

H-ARQ

H-ARQ stands for Hybrid-ARQ (Auto Repeat request). This is a method of combining two basic technologies for improving information bit transmission efficiency, that is error correction code (FEC) and automatic repeat request (ARQ). (A) of FIG. 26 is a block diagram of a transmitter of a transmission system having the H-ARQ method, and (B) of FIG. 26 is a block diagram of a receiver.

In the transmitter of (A) of FIG. 26, an encoding unit 6a encodes transmission data at a predetermined encoding ratio. A punctured encoding unit 6b achieves a required encoding ratio using a punctured code pattern, and a data modulation unit 6c performs data modulation, and transmits the data. Generally the data modulation methods that are available are QPSK, 16QAM and 64QAM. A signal demodulation unit of the receiver in (B) of FIG. 26 has a configuration to perform retransmission/combining after punctured decoding, a data demodulation unit 7a performs data demodulation according to a modulation method, a punctured decoding unit 7b performs punctured decoding according to the encoding ratio, using a punctured code pattern, and a retransmission/combining unit 7c combines a data previously received and stored and the receive data, if this receive data is retransmission data. By this, higher receive quality can be obtained. A turbo decoding unit 7d performs error correction decoding processing on the combined data. H-ARQ retransmission control is performed according to the following procedure.

(1) The transmitter encodes information bits.
(2) The code bits are sent.
(3) The receiver corrects errors. Processing ends if decoding is performed correctly.
(4) If decoding fails, the receive data is stored, and retransmission is requested to the transmitter.
(5) The transmitter retransmits the code bits transmitted in (2).
(6) The receiver combines the stored data and retransmitted data, and executes the decoding processing on the resulting data.
(7) The above procedure is repeated until a predetermined maximum number of times of retransmission.

In the above H-ARQ retransmission control, a method for always sending all code bits at the initial transmission and retransmission is called type-I H-ARQ or Chase Combining (CC), and a method for sending only a part of the code bits at initial transmission or retransmission is called type-II H-ARQ or Incremental Redundancy (IR).

Problems

When two LDPC systematic codes having the encoding ratio R0 and R1 (R0>R1), which are in a rate-compatible relationship, are C0 and C1, and the check matrix H1 of code C1 is generated from the check matrix H0 of code C0 which is a reference, the check matrix H1 is conventionally generated such that the weight number in the extended portion of the information bit portion of the check matrix H1 becomes a small value (see FIG. 22). With this conventional check matrix generation method, however, it is difficult to make the weight distributions of the check matrix H0 and check matrix H1 after extension to be the optimum simultaneously. This difficulty generates similar in a case where the encoding ratio R0 is smaller than the encoding ratio R1 of code C1.

Also in the case of a conventional check matrix generation method, complicated processing is required to extend the check matrix, and a large size memory is required to hold the check matrix.

In the case of the retransmission control based on the IR method, puncturing is performed, but in the conventional check matrix generation method, codes obtained by applying puncturing are characteristically not the optimum.

SUMMARY OF THE INVENTION

With the foregoing in view, it is an object of the present invention to provide an LDPC check matrix generation method and device which can generate check matrixes H0 and H1 having optimum weight distributions simultaneously for both the reference code C0 and code C1, where C0 and C1 are two LDPC systematic codes having encoding ratios R0 and R1 which are in a rate-compatible relationship, and a check matrix H1 of code C1 is generated from the check matrix H0 of the reference code C0.

It is another object of the present invention to provide an LDPC check matrix generation method and device which can generate the check matrix H1 of the code C1 from the check matrix H0 of the reference code C0 using a simple processing without requiring a large size memory.

It is still another object of the present invention to provide a retransmission control method which can characteristically optimize the codes obtained by puncturing in the retransmission control based on the IR method.

LDPC Check Matrix Generation Method

The present invention is an LDPC check matrix generation method for generating a check matrix H1 of a code C1 from a check matrix H0 of a code C0, where the codes C0 and C1 are LDPC systematic codes having different encoding ratios in a rate-compatible relationship, and information bit sizes of the codes C0 and C1 are K respectively, and the parity bit sizes thereof are M0 and M1 respectively.

A first LDPC check matrix generation method of the present invention has steps of: selecting L number of rows out of the check matrix H0; separating an information bit portion and a parity bit portion constituting each of the selected rows into two respectively, such that each of the separated information bit portions includes one or more non-zero elements which are "elements different from 0"; creating a new first row by coupling one separated information bit porting and one separated parity bit portion and creating a new second row by coupling another separated information bit portion and another separated parity portion; and generating the check matrix H1 of the systematic code C1 by placing the new first and second rows in place of each of the selected L number of rows in the check matrix H0.

The first LDPC check matrix generation method of the present invention further comprises steps of: placing the coupled information bit portions and parity bit portions on the original positions in the new rows respectively; placing "0" in a position where an element is not placed in the new rows;

determining in the parity bit portion a column whose elements in the new first and second rows are "$0_s$"; and adding a new column next to said column and placing "1" at the first and second row positions of the added column.

A second LDPC check matrix generation method of the present invention in which each row in an information bit portion of the check matrix H0 of the code C0 has "a" number of non-zero elements which are "elements different from 0", and a quotient and a remainder when M1 is divided by M0 are m and r respectively, comprises: (1) selecting r rows out of the information bit portion of the check matrix H0, separating "a" number of non-zero elements included in each row into (m+1) number of groups, and regarding the elements included in each group as continuous (m+1) number of row elements of the information bit portion in the check matrix H1; (2) for each of (M0−r) rows other than the r rows in the information bit portion, separating "a" number of non-zero elements included in the row into m number of groups, and regarding elements included in each group as continuous m number of row elements of the information bit portion in the check matrix H1; generating the information bit portion of the check matrix H1 by M1 number of rows generated by the processing of (1) and (2); and generating a parity bit portion of the check matrix H1 by creating a step type matrix so that the number of zero elements of each column, excluding the last column, of a square matrix of M1 rows×M1 columns become 2.

A third LDPC check matrix generation method of the present invention in which each row in an information bit portion of the check matrix H1 for systematic the code C1 has "a" number of non-zero elements which are "elements different from 0", and a quotient and a remainder when M1 is divided by M0 are m and r respectively, comprises: (1) selecting (m+1) rows continuously out of the information bit portion of the check matrix H1, generating one row in an information bit portion of the check matrix H0 by performing vector sum of the selected (m+1) rows, and generating r rows in the information bit portion of the check matrix H0 in the same manner, (2) separating the remaining rows in the information bit portion of the check matrix H1 into (M0−r) number of groups each of which consists of m rows and generating (M0−r) rows in the information bit portion of the check matrix H0 by performing vector sum of the m rows constituting each group; and generating the information bit portion of the check matrix H0 by M0 number of rows generated by the processing of (1) and (2); and generating a parity bit portion of the check matrix H0 by creating, a step type matrix so that the number of non-zero elements of each column, excluding the last column, of a square matrix of M0 rows×M0 columns become 2.

LDPC Check Matrix Generator

A first or second LDPC check matrix generator of the present invention comprises: a storage unit for storing the check matrix H0; a check matrix creation unit for creating and outputting the check matrix H1 from the check matrix H0; and a switching unit for reading and outputting the check matrix H0 from the storage unit if the check matrix H0 is required, and outputting the check matrix H1 generated by the check matrix creation unit if the check matrix H1 is required, wherein the check matrix creation unit of the first LDPC check matrix generator creates the check matrix H1 based on the first LDPC check matrix generation method, and the check matrix creation unit of the second LDPC check matrix generator creates the check matrix H1 based on the second LDPC check matrix generation method.

A third LDPC check matrix generator of the invention comprises: a storage unit for storing the check matrix H1; a check matrix creation unit for creating and outputting the check matrix H0 from the check matrix H1; and a switching unit for reading and outputting the check matrix H1 from the storage unit if the check matrix H1 is required, and outputting the check matrix H0 created by the check matrix creation unit if the check matrix H0 is required, wherein the check matrix creation unit creates the check matrix H0 based on the third LDPC check matrix generation method.

LDPC Code Retransmission Method

The present invention is an LDPC code retransmission method for receiving, on a receive side, a code transmitted from a transmission side, and requesting retransmission to the transmission side and storing the received code if information cannot be correctly decoded from the received code, and combining a retransmitted code retransmitted from the transmission side with the stored code and decoding the combined code. This LDPC code retransmission method comprises steps of: transmitting code C0 from the transmission side transmits wherein C0, C1, C2, . . . are rate-compatible codes and H0, H1, H2, . . . are check matrices created by said LDPC check matrix generation method, if the receive side fails in normal reception of the code C0, combining all the bits not included in the code C0, out of the code C1, with a part of the code C0 having a size according to the difference between the number of said bits and the number of transmittable bits, and retransmitting the result, then if the receive side fails in normal reception of the code Ci, combining all the bits not included in the code Ci, out of the code Ci+1, with a part of the code Ci having a size according to the difference between the number of said bits and the number of transmittable bits and retransmitting the result; and on the receive side performing decode procession sequentially using the generated check matrices H0, H1, H2, . . . .

BRIEF DESCRIPTION OF THE DRAWINGS

FIG. 17 is a diagram depicting a weight number distribution of an LDPC check matrix;

DESCRIPTION OF THE PREFERRED EMBODIMENTS (A) First Embodiment

Figure 1:
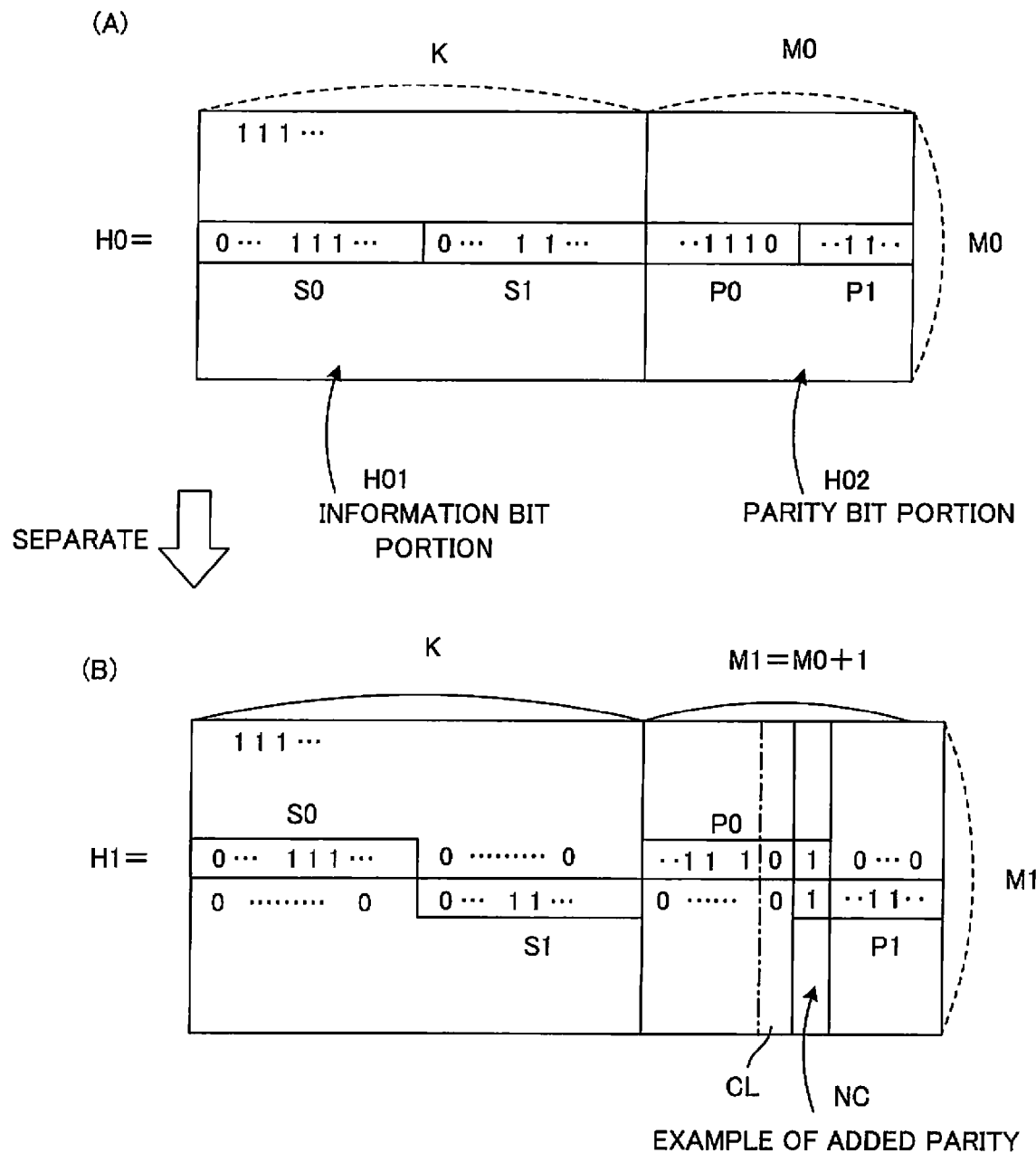
FIG. 1 is a diagram depicting a check matrix generation method of the first embodiment.

FIG. 1 is a diagram depicting a check matrix generation method according to the first embodiment.

Figure 21:
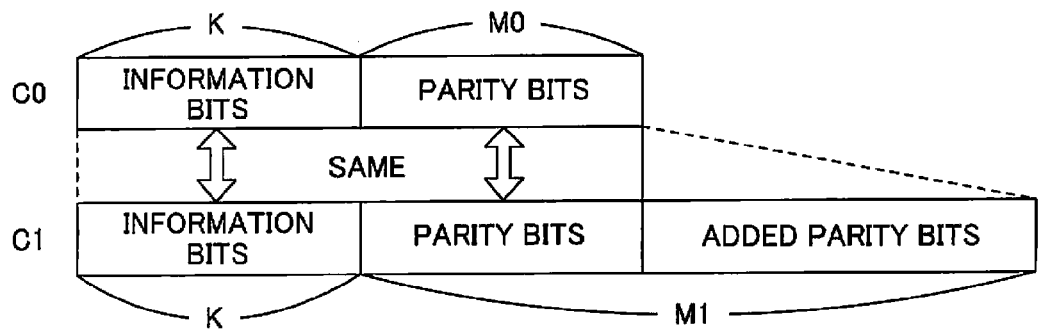
FIG. 21 is a diagram depicting a rate-compatible code.
Figure 22:
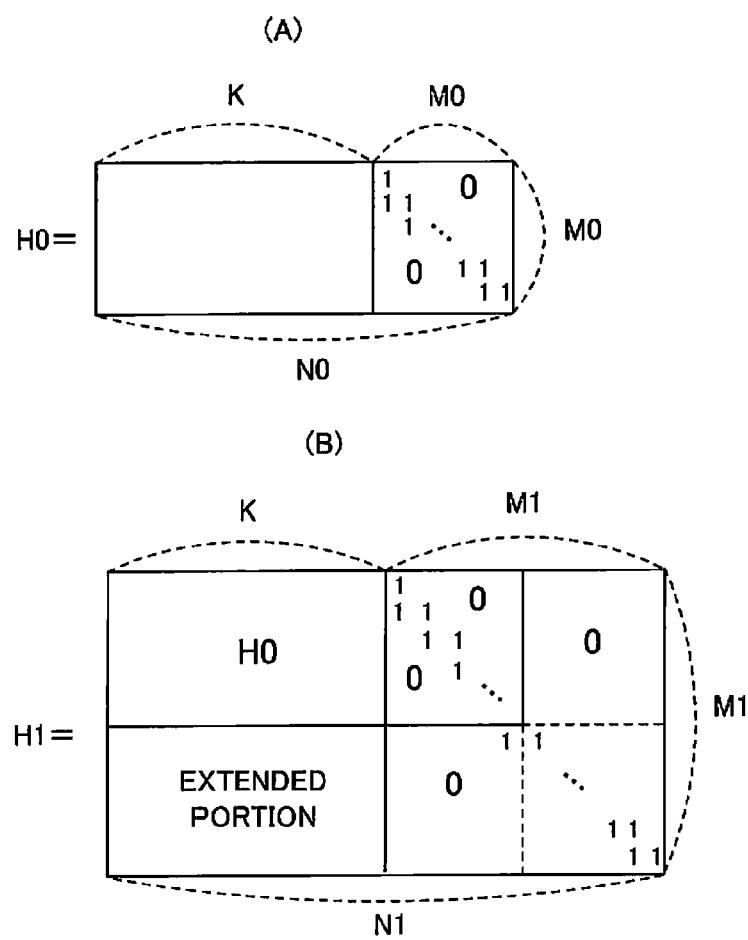
FIG. 22 is a diagram depicting a check matrix of a rate-compatible LDPC code.
Figure 23:
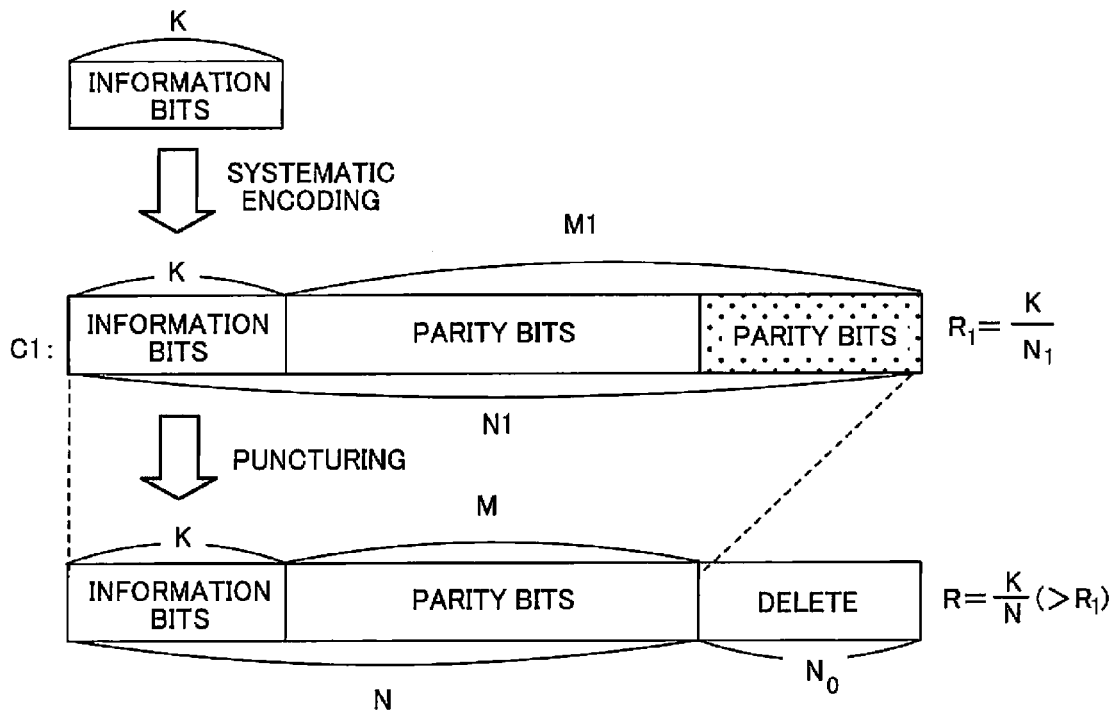
FIG. 23 is a diagram depicting puncturing.
Figure 24:
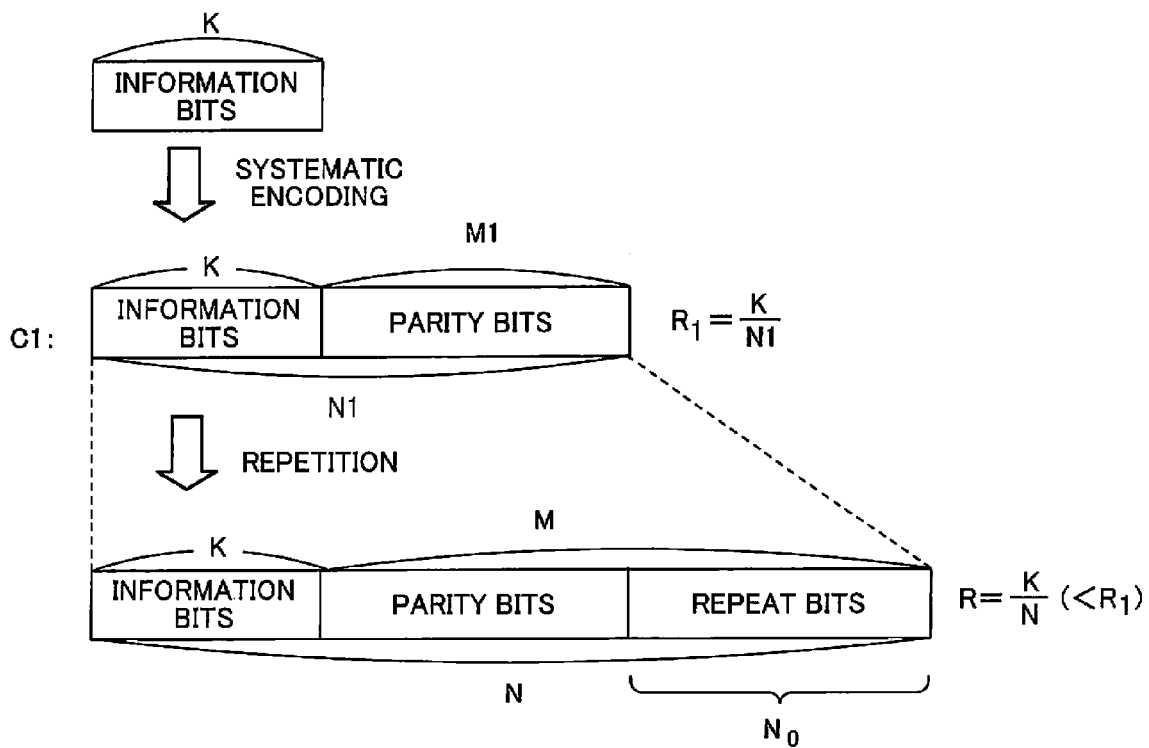
FIG. 24 is a diagram depicting repetition.
Figure 25:
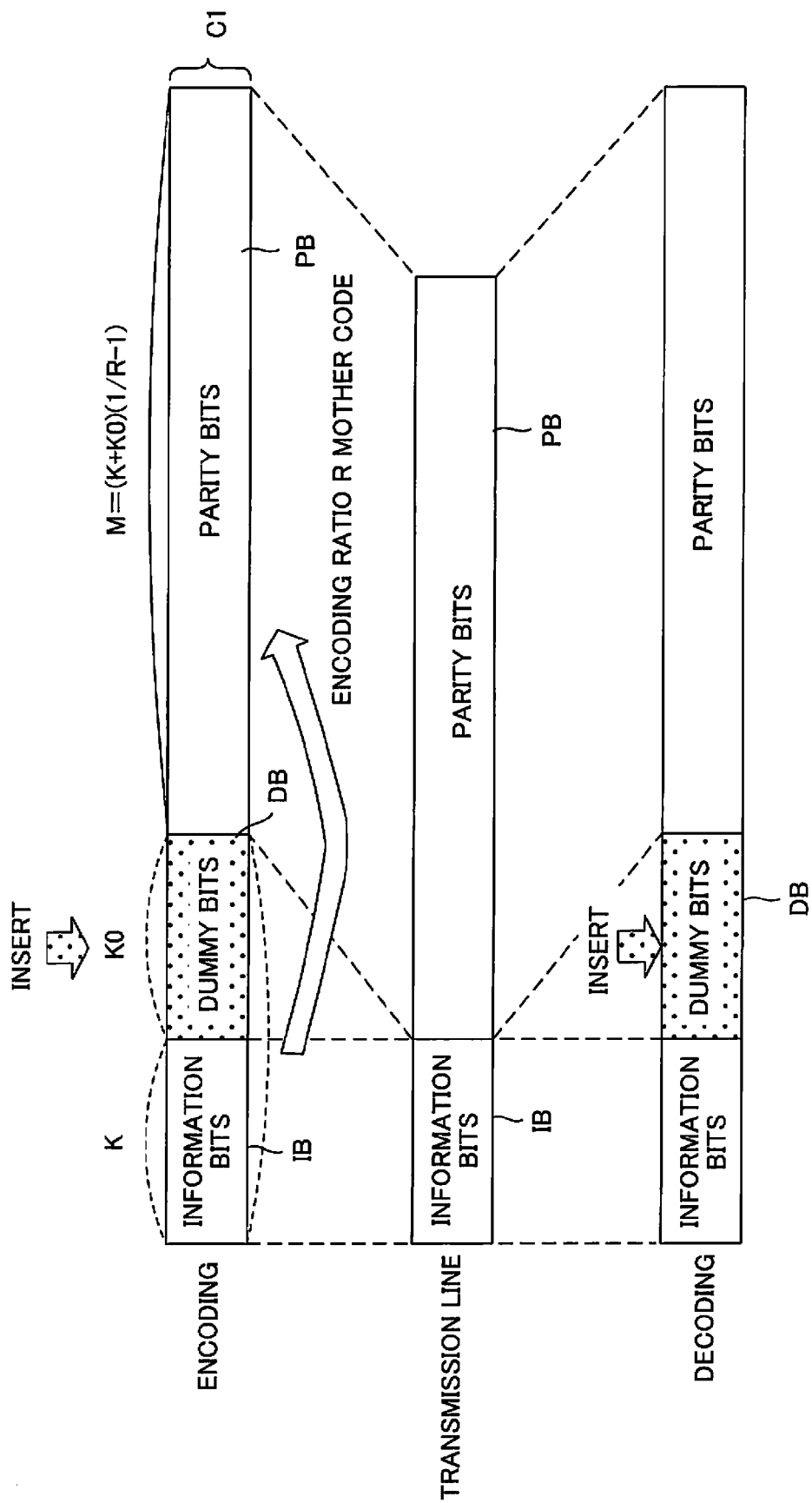
FIG. 25 is a diagram depicting a dummy bit insertion method.
Figure 26:
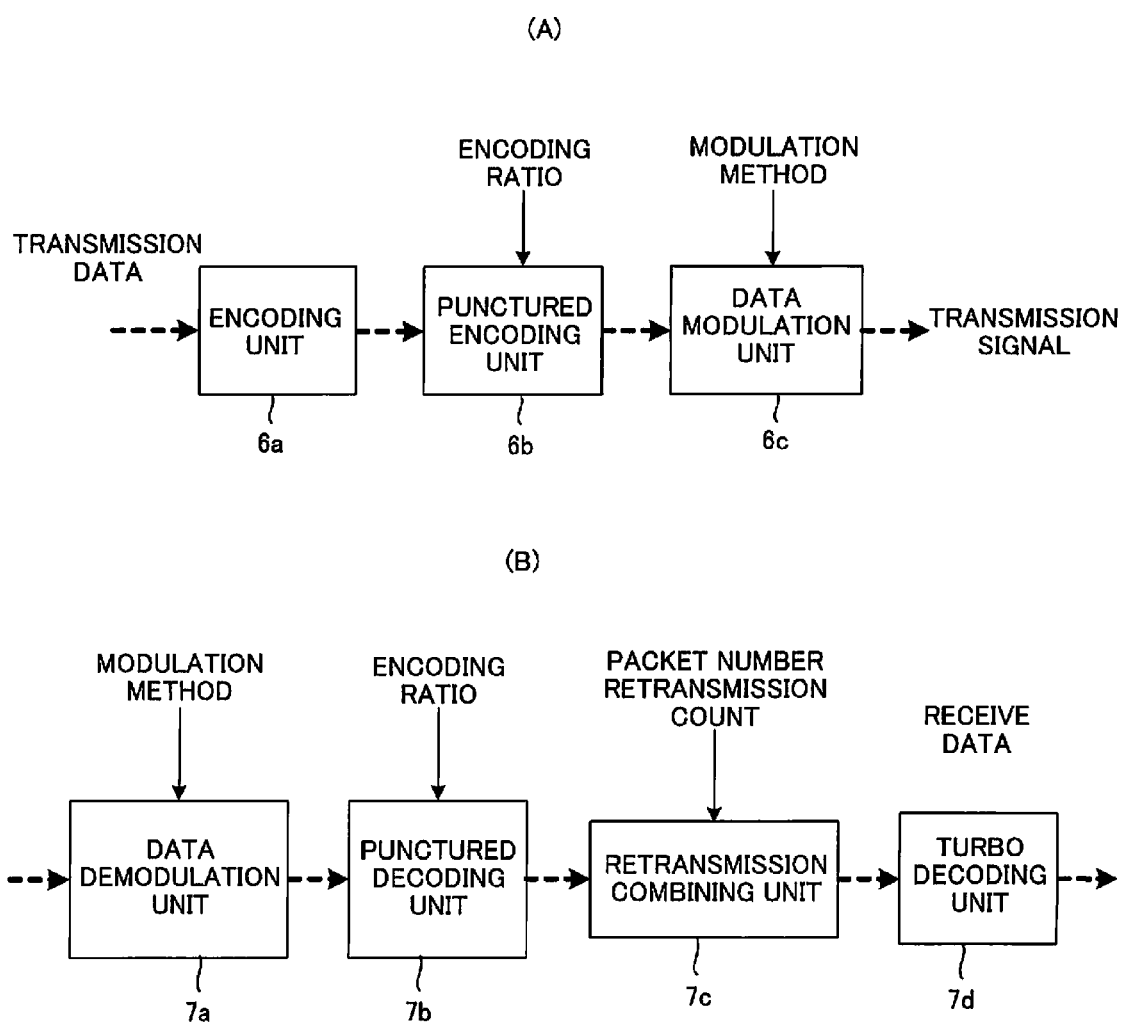
FIG. 26 is a diagram depicting Hybrid-ARQ (Auto Repeat request).

In a system for transmitting/receiving information bits, a transmitter is provided with a function for generating two LDPC codes C0 and C1 (see FIG. 21) having different encoding ratios which are in a rate-compatible relationship and transmitting these codes, and a receiver is provided with a function for receiving the two LDPC codes C0 and C1 having different encoding ratios and decoding these codes.

The LDPC codes C0 and C1 are both systematic codes, and the information bit sizes thereof are K and parity sizes thereof are M0 and M1=M0+1 respectively. The parity bits of the code C1 are created by adding one parity bit to the parity bits of the code C0. Weight distribution of a check matrix H0 of the code C0 is optimized so that a irregular LDPC code can be generated.

In this case, a check matrix H1 of the code C1 is generated from the check matrix H0 as follows.

As (A) of FIG. 1 shows, one row (i-th row) of the check matrix H0 is selected, an information bit portion of the i-th row positioned at H01 is separated into two groups, S0 and S1, and a parity bit portion of the i-th row positioned at H02 is also separated into two groups, P0 and P1. Then S0 and P0 are adopted to generate a new first row, and S1 and P1 are adopted to generate a new second row. Each of the groups S0 and S1 must include one or more non-zero elements which are "elements different from 0".

In the case of information alphabets having q number of different values, a term of non-zero element is appropriate, but if q=2, non-zero element is "1" element. Therefore "1" instead of the term of non-zero element is used herein below.

If the result of adding the bits of code C0 $(u_0, u_1, \ldots, u_{K-1}, p_0, p_1, \ldots, p_{M-1})$ corresponding to the element "1" included in each group S0, S1, P0 and P1 is s0, s1, p0 and p1, then the i-th parity check relational expression of the check matrix H0 becomes $$s0+s1+p0+p1=0 \quad (5)$$

Then instead of the selected i-th row in the check matrix H0, two new first and second rows (S0, P0; S1, P1) grouped as shown in (B) of FIG. 1 are placed. After this, an element 0 is placed in a position where any of the groups S0, S1, P0 and P1 does not occupy, in an information bit portion and parity bit portion of the new first and second rows. Finally one column position CL of which element on each of the first and second rows is 0 in the parity bit portion is determined, a new one column NC is added next to this column position CL, and an element "1" is positioned at the first and second row positions of this added column NC. By this, the generation of the check matrix H1 of code C1 ends.

If the parity bit corresponding to the added row is pa, the parity check relational expression of the check matrix H1 is $$s0+p0+pa=0$$

$$s1+pa+p1=0 \quad (6)$$

Since s0, s1, p0 and p1 are known, the parity bit pa is determined by Expression (6), and code $c1=(u_0, u_1, \ldots, u_{K-1}, p_0, p_1, \ldots, p_{M-1})$ can be generated.

The above is the case of M=M0+1, but in the case of M1=M0+L, the check matrix H1 of the code C1 is generated as follows.

(1) First, an arbitrary L number of rows are selected from the check matrix H0, and an information bit portion and parity bit portion of each of the selected rows are separated into two, such that each of the separated information bit portions includes one or more "1s".

(2) When the separated information bit portions are IB1 and IB2, and the separated parity bit portions are PB1 and PB2, new first and second rows are generated for each of the selected L number of rows by coupling IB1 and PB1 and coupling IB2 and PB2, or the new first and second rows are generated by coupling IB1 and PB2 and coupling IB2 and PB1 respectively. The bit portion IB1, IB2, PB1 and PB2 occupies the same position in the new row as the position in each of the selected L number of rows.

(3) In the check matrix H0, the new first and second rows are placed instead of each of the selected L number of rows respectively.

(4) In the information bit portion and parity bit portion of the L sets of the new first row and second row, "0" (element "0") is inserted at a position where any bit portion of IB1, IB2, PB1 and PB2 does not occupy to produce a matrix.

(5) In the parity bit portion of the matrix, obtained in the step (4), a column of which elements on the new first and second row of the first set are "0s" is determined, a new column is added next to this column, and "1" (element "1") is placed at the first and second row positions of this added column.

(6) The processing in (5) is repeated for the remaining second to Lth sets in the same manner, and new L columns are placed in the parity bit portion of the matrix to generate the check matrix H1 of the code C1.

Figure 2:
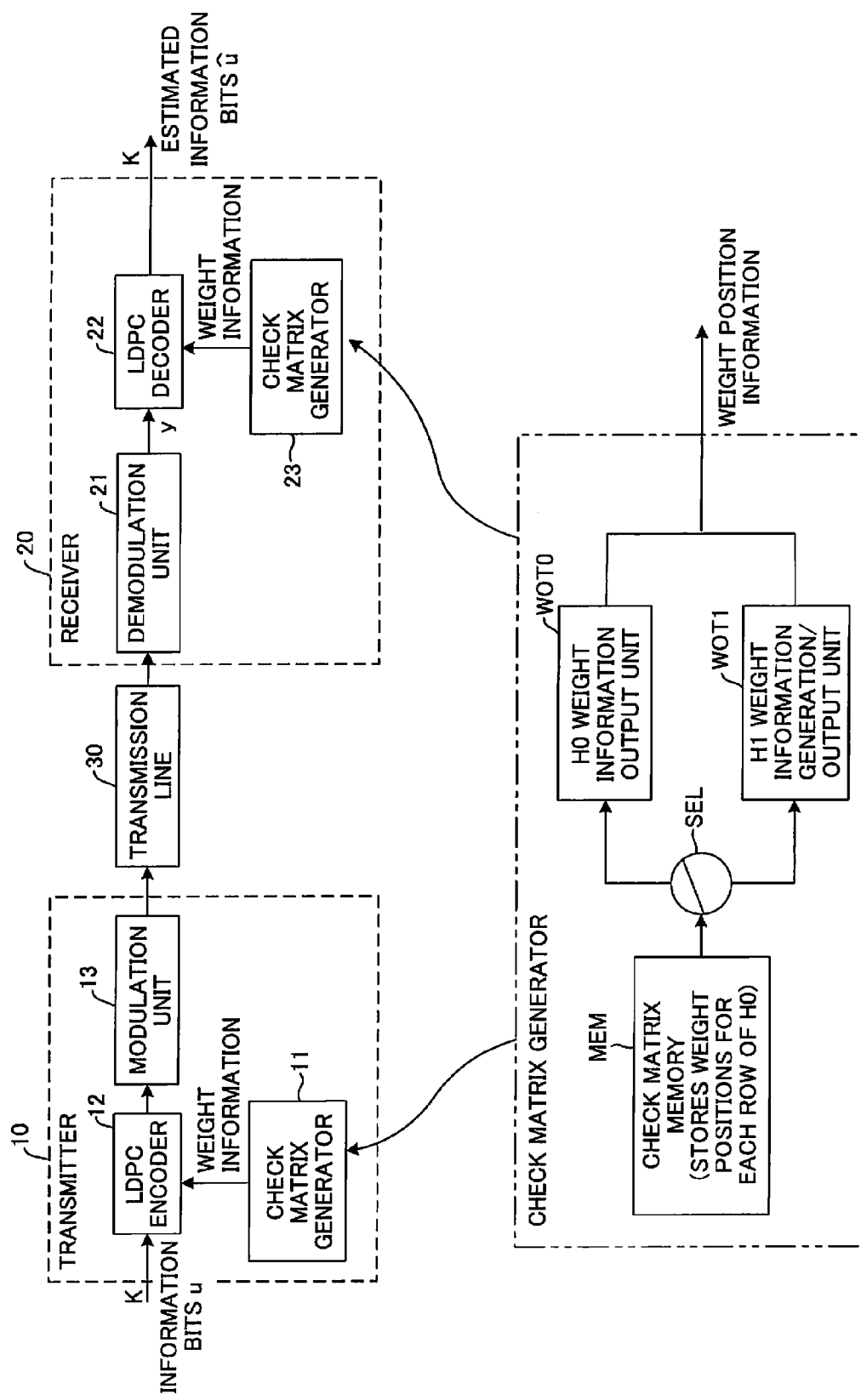
FIG. 2 is a block diagram depicting a communication system of a first embodiment, in which a transmitter encodes and a receiver decodes data.

FIG. 2 is a block diagram depicting a communication system of the first embodiment where data is encoded by a transmitter and decoded by a receiver, where the transmitter 10 encodes information bits u into two rate-compatible LDPC codes C0 and C1 having different encoding ratios, and sends these codes as occasional demands. These LDPC codes C0 and C1 are systematic codes, of which information bit sizes are K and parity sizes are M0 and M1 (M0<M1) respectively. It is assumed that the weight distribution of the check matrix H0 of the code C0 has been optimized and known so that irregular LDPC codes can be generated.

In the transmitter 10, a check matrix generator 11 stores weight position (position of element 1) information on each row of the check matrix H0 in a memory MEM. In the case of generating the code C0, a selector SEL inputs the weight information on the check matrix H0, which was read from the memory MEM, to an H0 weight information output unit W0T0, and the H0 weight information output unit W0T0 inputs the weight information on this H0 to an LDPC encoder 12. In the case of generating the code C1, the selector SEL inputs the weight information on the check matrix H0, which was read from the memory MEM, to an H1 weight information generation/output unit W0T1, and the H1 weight information generation/output unit W0T1 generates the check matrix H1 on the code C1 according to the method described in FIG. 1, and inputs this weight information to the LDPC encoder 12.

The LDPC encoder 12 LDPC-encodes the information bits u using the weight information on the check matrix H0, H1 which was input, and a modulation unit 13 modulates sends the LDPC code. The LDPC encoder 12 determines parity bits $p_0$ to $p_{M-1}$ by the parity check expression, and generates LDPC code C0 or C1 by combining the parity bits $p_0$ to $p_{M-1}$ with the information bits $u_0$ to $u_{K-1}$ in serial.

A receiver 20 comprises a demodulation unit 21 for demodulating a signal received via a transmission line 30, an LDPC decoder 22 for decoding originally transmitted K bit information u from the received information, and a check matrix generator 23 having a same configuration as the check matrix generator 11 in the transmitter. The check matrix generator 23 inputs the weight information on the check matrix H0 to the LDPC decoder 22 in the case of receiving the LDPC code C0, and inputs the weight information on the check matrix H1 to the LDPC decoder 22 in the case of receiving the LDPC code C1. The LDPC decoder 22 performs a known LDPC decoding processing using the weight information on the check matrix which was input, and estimates the information u using the received signal, and outputs the result.

(B) Second Embodiment

Figure 3:
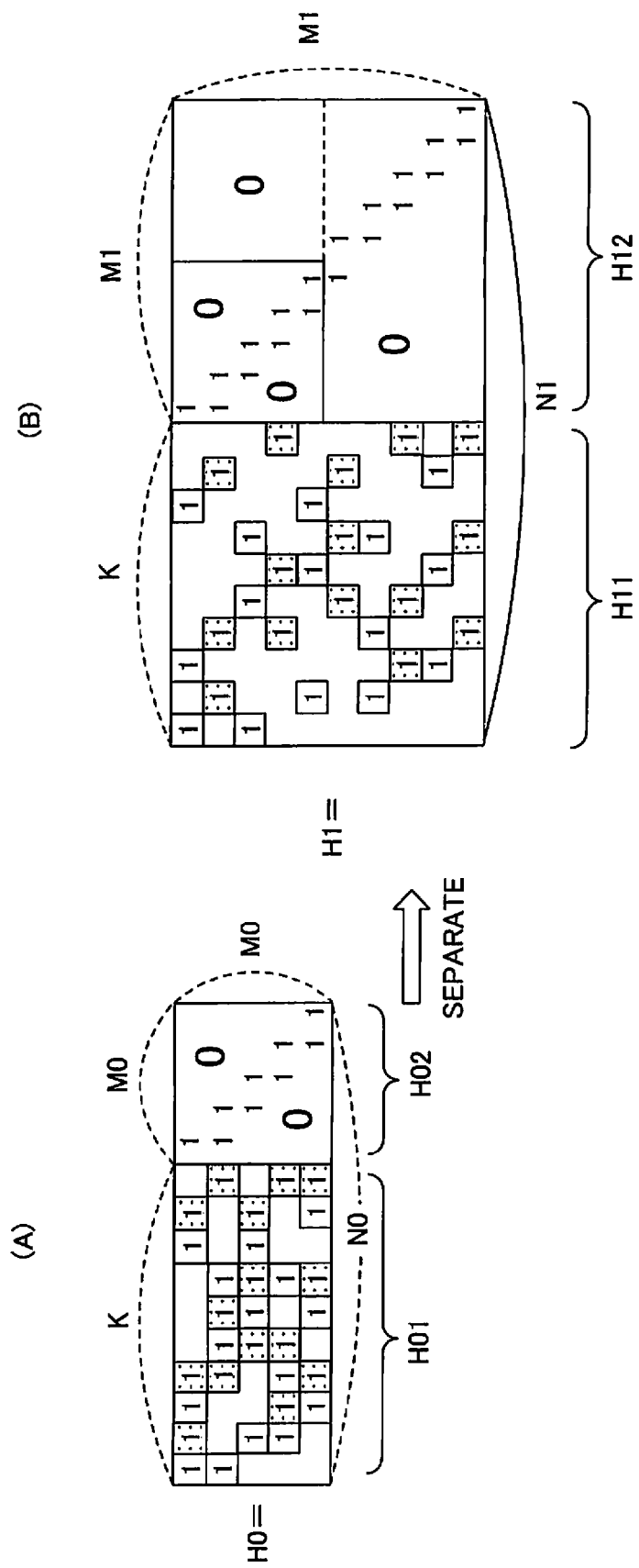
FIG. 3 is a diagram depicting a method for generating a check matrix of an LDPC code C1 having a small encoding ratio from a check matrix of an LDPC code C0 having a large encoding ratio (second embodiment)

FIG. 3 is a diagram depicting a check matrix generation method according to the second embodiment.

In a system for transmitting/receiving information bits, a transmitter is provided with a function for encoding information bits into two rate-compatible IRA codes C0 and C1 (see FIG. 21) having different encoding ratios, and transmitting these codes, and a receiver is provided with a function for receiving the two LDPC codes C0 and C1 having different encoding ratios, and decoding these codes. The IRA codes C0 and C1 are LDPC codes, and are both systematic codes, and the information bit sizes thereof are K and parity sizes thereof are M0 and M1 respectively, and code bit sizes are N0 and N1 respectively. Here N0=K+M0, N1=K+M1 and M1=2×M0. A parity bit portion H02 of the check matrix H0 of the IRA code C0 is in a step type matrix, where the weight number of the column is 2 except for last column, as shown in (A) of FIG. 3. In this case, the check matrix H1 of the code C1 is generated from the check matrix H0 as follows.

As (B) of FIG. 3 shows, a weight of each row of an information bit portion H01 of the check matrix H0 is separated in half into 2 rows, and an information bit portion H11 of the check matrix H1 is constructed in each row. A parity bit portion H12, which is a step type matrix having a weight number 2 in an M1×M1 size is added to this, and the result is regarded as the check matrix H1 of the code C1.

The newly constructed check matrix H1 is an IRA code check matrix, of which column weight distribution is the same as H0, and the weight number of the rows of the information bit portion is a/2, half of H0. Half of the parity bits of the code C1 created using this check matrix H1 match the parity bits of the code C0, and are in a rate-compatible relationship. This will be shown below.

If Sn is the sum of the a/2 number of information bits and Pn (n=0, 1, . . . ) are parity bits, the parity check relational expression of the code C0 is $$s0 + s1 + p0 = 0 \qquad (7)$$
$$s2 + s3 + p0 + p1 = 0$$
$$s4 + s5 + p1 + p2 = 0$$
$$s6 + s7 + p2 + p3 = 0$$
$$\vdots$$

On the other hand, if pn' (n=0, 1, . . . ) are parity bits of the code C1, the parity check relational expression of the code C1 is $$s0 + p0' = 0 \qquad (8)$$
$$s1 + p0' + p1' = 0$$
$$s2 + p1' + p2' = 0$$
$$s3 + p2' + p3' = 0$$
$$\vdots$$

When expressions are added two at a time from the top, the expressions become $$s0 + s1 + p1' = 0 \qquad (9)$$
$$s2 + s3 + p1' + p3' = 0$$
$$\vdots$$

Comparing the parity bits pn of the code C0 and the parity bits pn' of the code C1, a relationship of $$p(2 \times n'+1)=pn$$

is established. This means that an odd parity bit of the code C1 and a parity bit of the code C0 match in the provided information bits u, and that the code C0 and the code C1 are rate-compatible codes.

Figure 4:
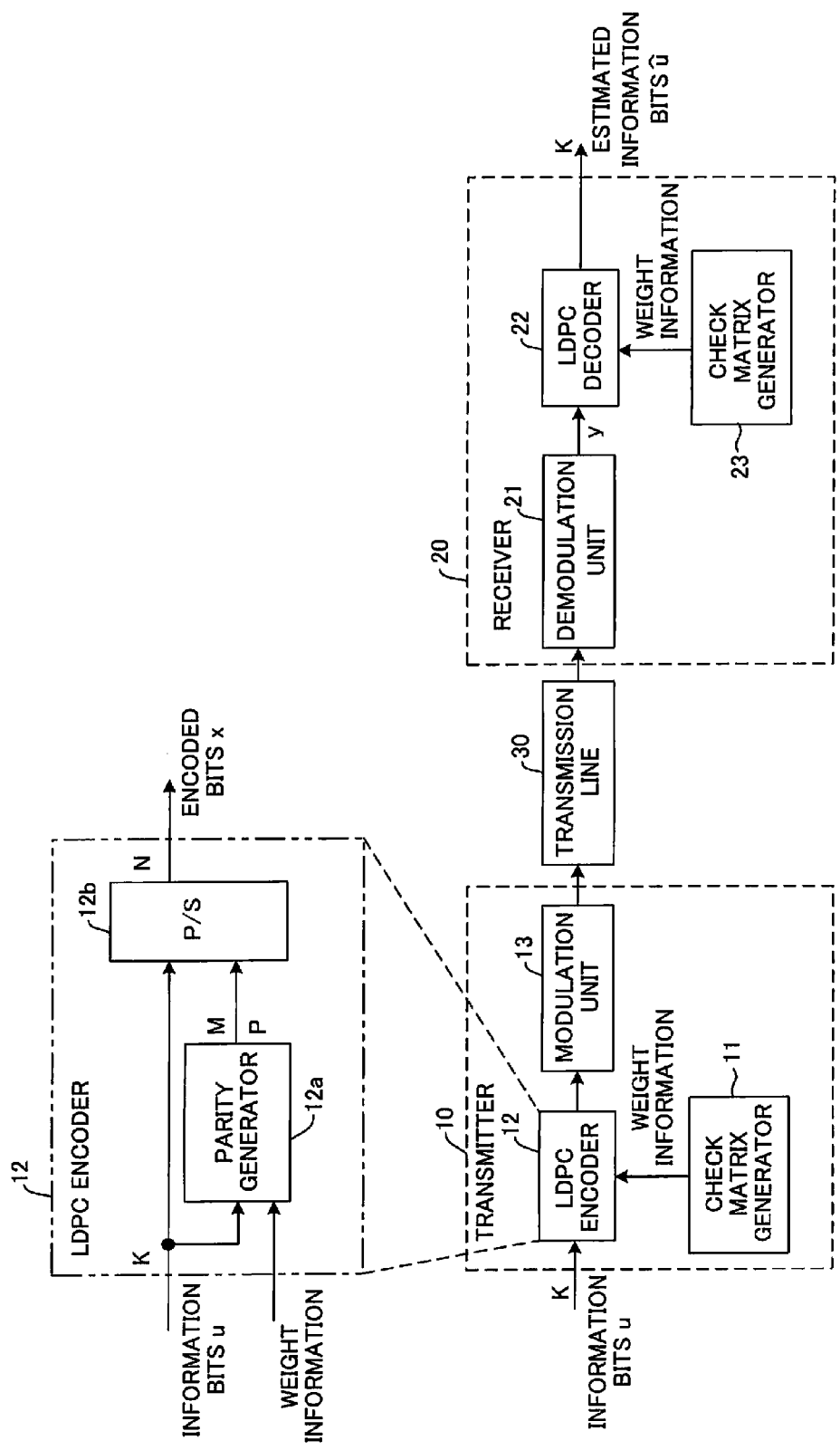
FIG. 4 is a block diagram depicting a communication system of a second embodiment, in which a transmitter encodes and a receiver decodes data.

FIG. 4 is a block diagram depicting a communication system of the second embodiment where data is encoded by a transmitter and decoded by a receiver, where the transmitter 10 encodes information units u into two rate-compatible IRA codes C0 and C1 having different encoding ratios, and transmits these codes. These IRA codes C0 and C1 are LDPC codes and also systematic codes, of which information bit sizes are K and parity sizes are M0 and M1 respectively, and the code bit sizes are N0 and N1 respectively. Here N0=K+M0, N1=K+M1 and M1=2×M0. It is assumed that the weight distribution of the check matrix H0 of the code C0 has been optimized and known, so that irregular LDPC codes can be generated.

In FIG. 4, the same portions as the communication system in FIG. 2 are denoted with the same reference symbols. In the case of generating the code C0, a check matrix generator 11 inputs the weight information on the check matrix H0, which was read from an internal memory, to an LDPC encoder 12. In the case of generating the code C1, the check matrix generator 11 generates the check matrix H1 of the code C1 from the weight information on the check matrix H0 read from the memory by a method described in FIG. 3, and inputs the weight information to the LDPC encoder 12.

The LDPC encoder 12 comprises a parity generator 12a for generating an M0 or M1 number of parity bits p using the weight information on the check matrix H0, H1 which was input, and a P/S conversion unit 12b for combining K bits of information u and M bits of parity bits p, and outputting LDPC code x which is an IRA code. The parity generator 12a determines parity bits $p_0$ to $p_{M-1}$ based on a parity check expression (see Expression (3)) using the weight information on the check matrix, and the P/S conversion unit 12b combines these parity bits $p_0$ to $p_{M-1}$ with the information bits $u_0$ to $u_{K-1}$ in serial, to generate the LDPC code C0 or C1, and a modulation unit 13 modulates and outputs the LDPC code.

In a receiver 20, a check matrix generator 23 inputs the weight information on the check matrix H0 to an LDPC decoder 22, in the case of receiving the LDPC code C0, and inputs the weight information on the check matrix H1 to the LDPC decoder 22 in the case of receiving the LDPC code C1. The LDPC decoder 22 performs a known LDPC decoding processing using the weight information on the check matrix which was input, and estimates the information u by the received signal, and outputs the result.

In the above second embodiment, the special case of M1=2·M0 was shown, but if this relationship is not established, the check matrix H1 is generated as follows. Here it is assumed that two LDPC systematic codes having different encoding ratios which are in a rate-compatible relationship are C0 and C1, and the information bit sizes of the codes C0 and C1 are K, and parity bit sizes thereof are M0 and M1 (M0<M1) respectively. In addition, the code C0 is an IRA code, each row in the information bit portion of the check matrix H0 for the code C0 has "a" number of 1s, and the quotient and the remainder when M1 is divided by M0 are m and r respectively.

(1) r rows are selected out of the information bit portion of the check matrix H0, "a" number of 1s included in each row are separated into (m+1) number of groups, and elements included in each group are regarded as continuous (m+1) number of row elements of the information bit portion in the check matrix H1.

(2) For each of (M0−r) rows other than the r rows in the information bit portion, "a" number of is included in the row are separated into m number of groups, and elements included in each group are regarded as a continuous m number of row elements of the information bit in the check matrix H1, and an information bit portion H11 of the check matrix H1 is generated by M1 number of rows generated by the processing of (1) and (2).

(3) For a parity bit portion of the check matrix H1, a step type matrix is generated so that the weight numbers of each column, excluding the last column, of a square matrix of M1 rows×M1 columns become 2, and this matrix is regarded as the parity bit portion H12 of the check matrix H1.

By the above steps (1) to (3), the check matrix H1 can be generated. If "a" cannot be exactly divisible by (m+1) or m, the remainder elements are distributed to each groups one by one.

According to the second embodiment, the check matrix H1 can be generated so that the code C1 becomes rate-compatible with the optimum code C0.

According to the second embodiment, the check matrix H1 of which weight number decreases as the encoding ratio decreases can be generated, and a good code C1 can be created. In particular, if the number of parity bits increases, that is if the encoding ratio becomes small, the value of "a" becomes small and a code with good characteristics can be created. In other words, according to the second embodiment, the weight distribution of the check matrix H1 can be close to optimum.

According to the present invention, the check matrix H1 of the code C1 can be generated from the check matrix H0 of the code C0 with a simple operation, without requiring a large size memory.

(C) Third Embodiment

The second embodiment can be extended to cyclic matrix type IRA codes. In a system for transmitting/receiving information bits, a transmitter is provided with a function for encoding information bits into two IRA codes, C0 and C1, having different encoding ratios and transmitting these codes, and a receiver is provided with a function for receiving the two LDPC codes C0 and C1 (see FIG. 21) having different encoding ratios, and decoding these codes. The information bit sizes of the codes C0 and C1 are K, parity sizes thereof are M0 and M1 respectively, and code bit sizes are N0 and N1 respectively. Here N0=K+M0, N1=K+M1, and M1=2·M0. It is assumed that the size of the cyclic matrix is z×z, and that M0, M1 and K are exactly divisible by z, and m0=M0/z, m1=M1/z and k=K/z.

Figure 5:
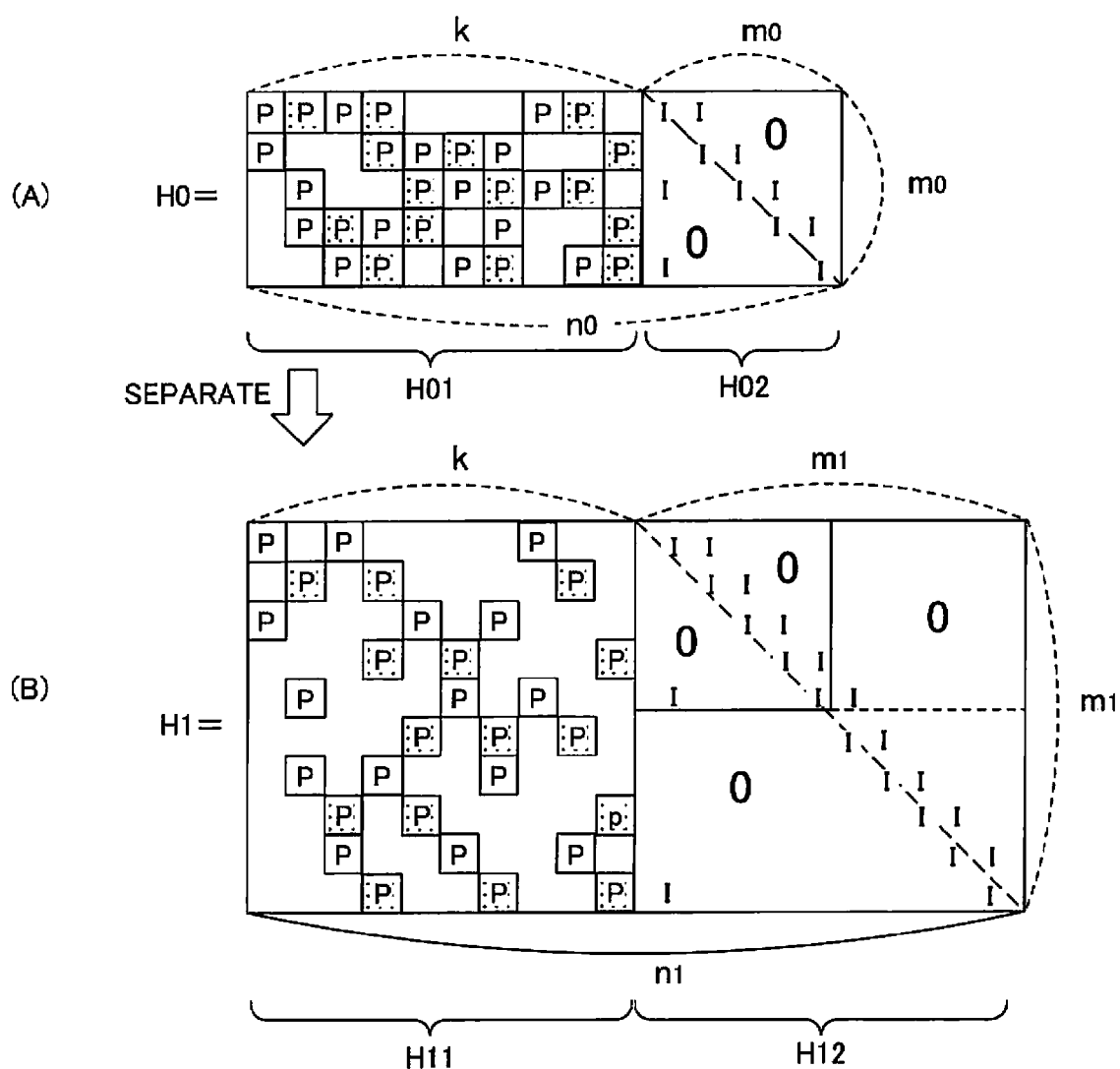
FIG. 5 is a diagram depicting a method for generating a check matrix H1 of a cyclic matrix type IRA code C1 from a check matrix H0 of a cyclic matrix type IRA code C0 (third embodiment)

FIG. 5 is a diagram depicting a method for generating the check matrix H1 of the cyclic matrix type IRA code C1 from the check matrix H0 of the cyclic matrix type IRA code C0. The check matrix H0 has a configuration shown in (A) of FIG. 5. As (B) of FIG. 5 shows, a weight of each row of an information bit portion H01 of the check matrix H0 is separated in half into two rows in cyclic matrix units (unit of size z), and the information bit portion H11 of the check matrix H1 is constructed by each row generated by separation. The parity bit portion H12, which is a step type matrix with an M1×M1 size and weight number 2, is added to this, and the check matrix H1 of the code C1 is created.

In this case, the parity check relational expressions are Expressions (7), (8) and (9), where each parameter can be expressed as a z size vector respectively as follows.

$$sn \rightarrow \begin{bmatrix} s(zn) \\ s(zn+1) \\ s(zn+2) \\ \vdots \\ s(zn+z-1) \end{bmatrix} \quad pn \rightarrow \begin{bmatrix} p(zn) \\ p(zn+1) \\ p(zn+2) \\ \vdots \\ p(zn+z-1) \end{bmatrix} \quad n=0,\ldots,m0\text{-}1 \qquad (10)$$

Therefore it is clear that the cyclic matrix type IRA codes C0 and C1 are rate-compatible codes.

According to the third embodiment, similar effects as the second embodiment can be implemented. The third embodiment can be applied to the creation of the check matrix of a code of which information bit size and parity bit size are big.

(D) Fourth Embodiment

The second embodiment is a case of generating the check matrix of the LDPC code C1 having a smaller encoding ratio from the check matrix H0 of the LDPC code C0 having a greater encoding ratio, but in the fourth embodiment, a check matrix of the LDPC code C0 having a greater encoding ratio is generated from a check matrix H1 of the LDPC code C1 having a smaller encoding ratio.

In other words, in a system for transmitting/receiving information bits, a transmitter is provided with a function for encoding information bits into two rate-compatible IRA codes C0 and C1 having different encoding ratios, and transmitting these codes, and a receiver is provided with a function for receiving the two LDPC codes C0 and C1 having different encoding ratios, and decoding these codes. The IRA codes C0 and C1 (see FIG. 21) are LDPC codes and are both systematic codes, and the information bit sizes thereof are K and parity sizes thereof are M0 and M1 respectively, and code bit sizes are N0 and N1 respectively. Here N0=K+M0, N1=K+M1 and M1=2×M0. A parity bit portion H12 of the check matrix H1 of the IRA code C1 has a construction of a step type matrix, where the weight number of each column is 2 except for the last column, as shown in (B) of FIG. 6.

Figure 6:
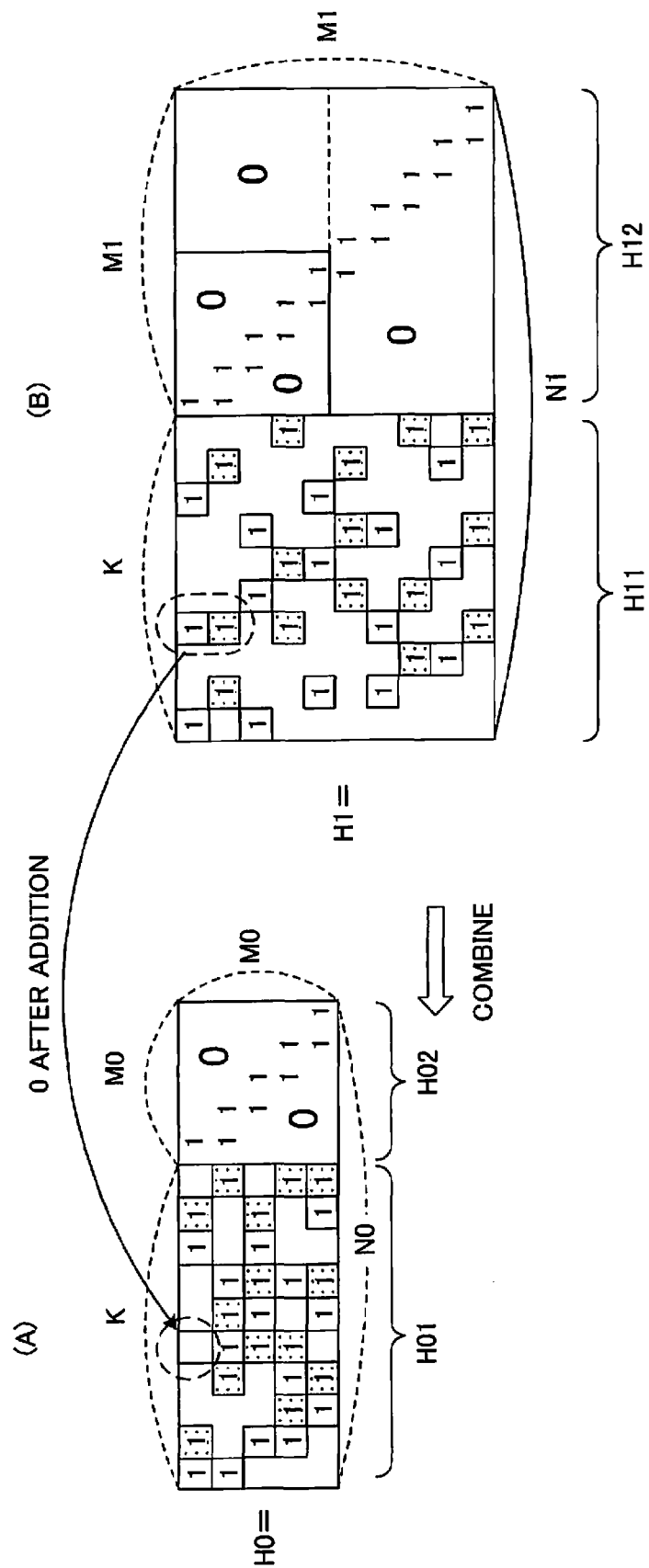
FIG. 6 is a diagram depicting a method for generating a check matrix of an LDPC code C0 having a large encoding ratio from a check matrix of an LDPC code C1 having a small encoding ratio (fourth embodiment)

In this case, the check matrix H0 of the code C0 (see (A) of FIG. 6) is generated from the check matrix H1 as follows. It is assumed that the codes C0 and C1 are IRA codes, and each row of the information bit portion H11 of the check matrix H1 of the code C1 has "a" number of 1s (a=3 in (B) of FIG. 6).

The rows in the information bit portion H11 of the check matrix H1 are separated into M0 number of groups each of which consists of two rows, and for each group, vector sum of the two rows constituting the group is performed, thereby the M0 rows of the information bit portion H01 of the check matrix H0 are generated. Then a step type matrix is generated so that the weight numbers of each column, except for the last column, of a square matrix of M0 rows×M0 rows become 2, and this matrix is regarded as the parity bit portion H02 of the check matrix H0. By this, the check matrix H0 of the code C0 can be generated from the check matrix H1 of the code C1. It should be noted that vector addition, 1+1=0.

The above is the case of M1=2×M0, but the fourth embodiment can be extended to the case of M1=m×M0+r. In this case, the check matrix H0 of the code C0 is generated from the check matrix H11 as follows. Here it is assumed that the codes C0 and C1 are IRA codes, each row in the information bit portion H11 of the check matrix H1 of the code C1 has "a" number of 1s, and the quotient and remainder when M1 is divided by M0 are m and r respectively. FIG. 6 is a case when m=2 and r=0.

(1) (m+1) rows are selected continuously out of the information bit portion H11 of the check matrix H1, and one row of an information bit portion H01 of the check matrix H0 is generated by performing vector sum of the selected (m+1) rows.

(2) r rows of the information bit portion H01 of the check matrix H0 are generated in the same.

(3) The remaining rows excluding the selected r×(m+1) rows in the information bit portion H11 of the check matrix H1 are separated into (M0−r) number of groups m rows by m rows, and (M0−r) rows of the information bit portion H01 of the check matrix H0 is generated by performing vector sum of the m rows constituting each group. The information bit portion H01 of the check matrix H0 can be generated by the processing of (1) to (3).

(4) A step matrix is generated so that the weight number of columns, excluding the last column, of a square matrix of M0 rows×M0 columns become 2, and this matrix is regarded as the parity bit portion H02 of the check matrix H0.

By the above (1) to (4), the check matrix H0 of the code C0 can be generated from the check matrix H1 of the code C1.

Figure 7:
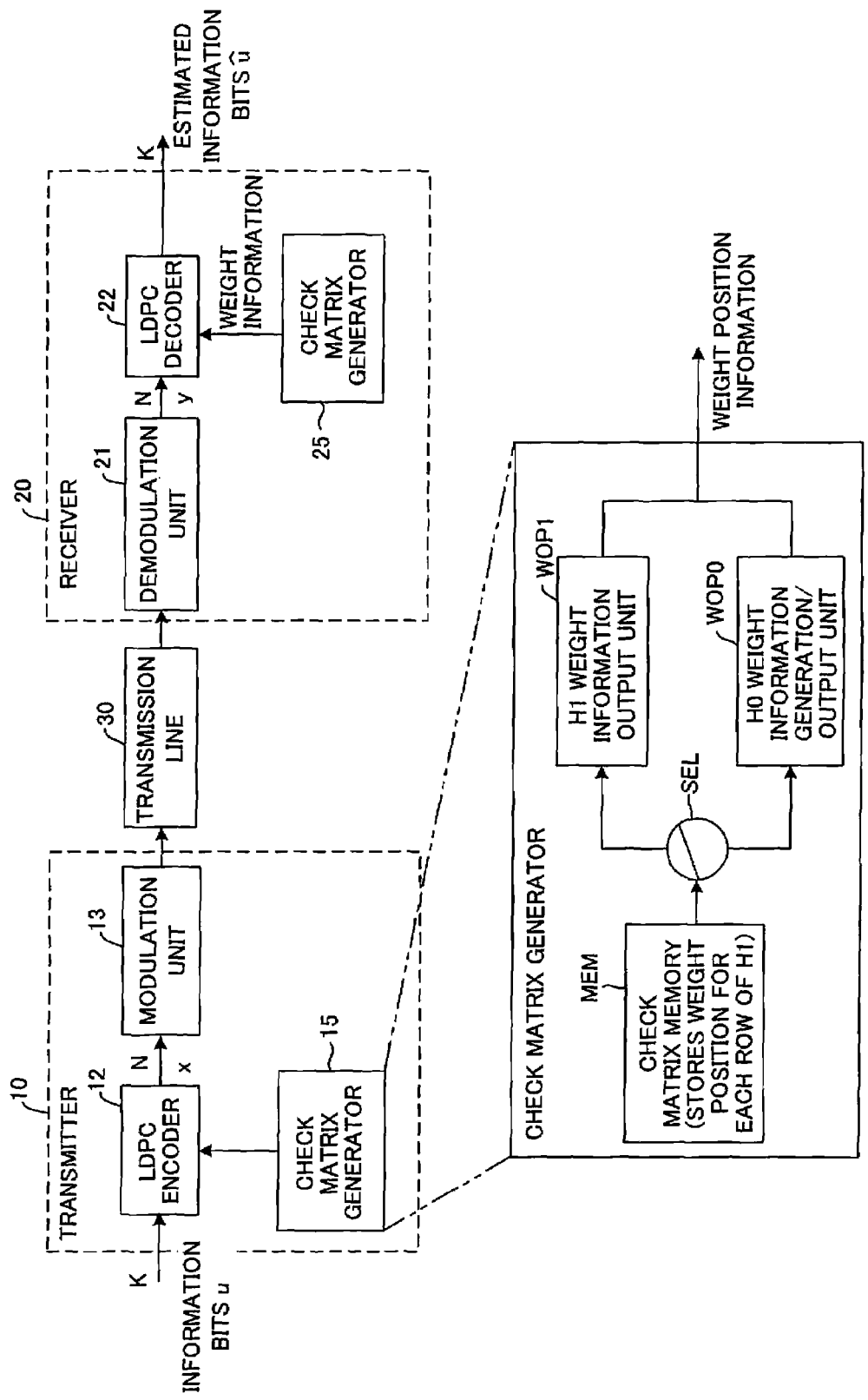
FIG. 7 is a block diagram depicting a communication system of the fourth embodiment in which a transmitter encodes and a receiver decodes data.

FIG. 7 is a block diagram depicting a communication system of the fourth embodiment where data is encoded by a transmitter and decoded by a receiver, where the transmitter 10 encodes information bits u into two rate-compatible IRA codes C0 and C1 having different encoding ratios and transmitting these codes. These IRA codes C0 and C1 are a kind of LDPC codes and are also systematic codes, of which information bit sizes are K, parity sizes are M0 and M1 respectively and code bit sizes are N0 and N1 respectively. Here N0=K+M0, N1=K+M1 and M1=2·M0. It is assumed that the weight distribution of the check matrix H1 of the code C1 has been optimized and known, so that irregular LDPC codes can be generated.

In FIG. 7, the same portions as the communication system in FIG. 2 are denoted with the same reference symbols. In the transmitter 10, a check matrix generator 15 stores weight position (position of element 1) information on each row of the check matrix H1 in a memory MEM. In the case of generating the code C1, a selector SEL inputs the weight information on the check matrix H1, which was read from the memory MEM, to a H1 weight information output unit W0P1, and the H1 weight information output unit W0P1 inputs the weight information on this H1 to an LDPC encoder 12. In the case of generating the code C0, the selector SEL inputs the weight information on the check matrix H1 which was read from the MEM, to a H0 weight information generation/output unit W0P0, and the H0 weight information generation/output unit W0P0 generates the check matrix H0 on the code C0 according to the method described in FIG. 6, and inputs this weight information to an LDPC encoder 12.

The LDPC encoder 12 LDPC-encodes the information bits u using the weight information on the check matrix H0, H1, which was input, and a modulation unit 13 modulates and sends the LDPC code. The LDPC encoder 12 determines parity bits $p_0$ to $p_{M-1}$ by the parity check expression (see Expression (3)), and generates LDPC code C0 or C1 by combining the parity bits $p_0$ to $p_{M-1}$ with the information bits $u_0$ to $u_{K-1}$ in serial, and the modulation unit 13 modulates and sends the LDPC code.

A receiver 20 comprises a demodulation unit 21 for demodulating a signal received via a transmission line 30, an LDPC decoder 22 for decoding the originally transmitted K-bit information u from the received information, and a check matrix generator 25 having a same configuration as the check matrix generator 15 in the transmitter. The check matrix generator 25 inputs the weight information on the check matrix H1 to the LDPC decoder 22 in the case of receiving the LDPC code C1, and inputs the weight information on the check matrix H0 to the LDPC decoder 22 in the case of receiving the LDPC code C0. The LDPC decoder 22 performs a known LDPC decoding processing using the weight information on the check matrix which was input, and estimates the information u using the received signal, and outputs the result.

According to the fourth embodiment, the check matrix H0 can be generated so that the code C0 becomes rate-compatible with the optimum code C1.

According to the fourth embodiment, the check matrix H0 of which weight number increases as the encoding ratio increases can be generated and a good code C0 can be created. In particular, if the number of parity bits decreases ½, that is if the encoding ratio becomes great, the value of "a" becomes great, and a code with good characteristics can be created. In other words, according to the second embodiment, the weight distribution of the check matrix H0 can be close to optimum.

According to the present invention, the check matrix H0 of the code C0 can be generated from the check matrix H1 of the code C1 with a simple operation, without requiring a large size memory.

(E) Fifth Embodiment

The fourth embodiment can be extended to cyclic matrix type IRA codes. In a system for transmitting/receiving information bits, a transmitter is provided with a function for encoding information bits into two IRA codes C0 and C1 having different encoding ratios, and transmitting these codes, and a receiver is provided with a function for receiving the two LDPC codes C0 and C1 having different encoding ratios, and decoding these codes. The information bit sizes of the codes C0 and C1 are K, parity sizes thereof are M0 and M1 respectively, and code bit sizes are N0 and N1 respectively. Here N0=K+M0, N1=K+M1 and M1=2×M0. It is assumed that the size of the cyclic matrix is z×z, and M0, M1 and K are exactly divisible by z, and m0=M0/z, m1=M1/z and k=K/z.

Figure 8:
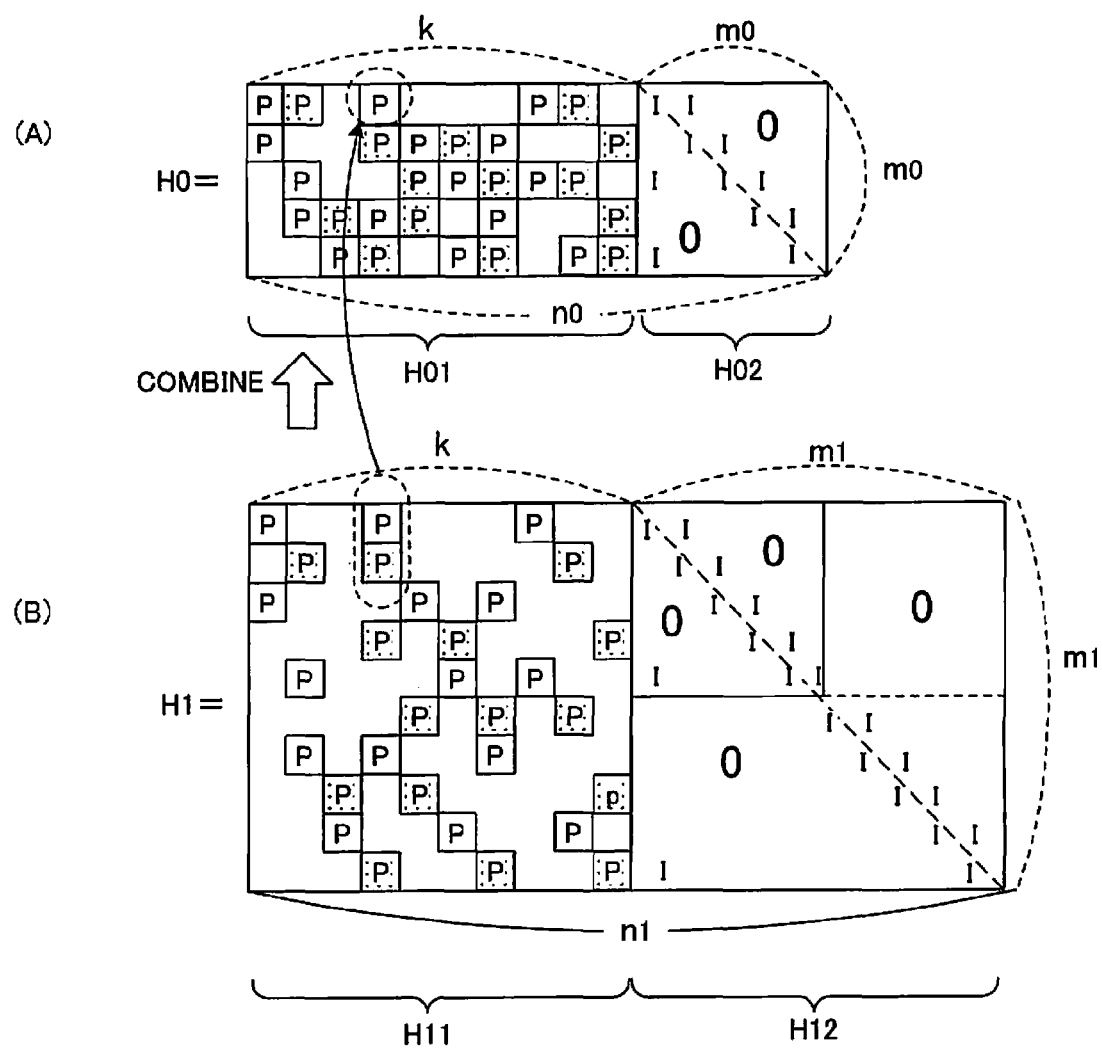
FIG. 8 is a diagram depicting a method for generating a check matrix H0 of a cyclic matrix type IRA code C0 from a check matrix H1 of a cyclic matrix type IRA code C1 (fifth embodiment)

FIG. 8 is a diagram depicting a method for generating the check matrix H0 of the cyclic matrix type IRA code C0 from the check matrix H1 of the cyclic matrix type IRA code C1. The check matrix H1 has a configuration shown in (B) of FIG. 8. As (B) of FIG. 8 shows, m1 rows of the information bit portion H11 of the check matrix H1 are separated into m0 number of groups each of which consist of two rows, and for each group, rows constituting the group is performed, thereby the m0 rows of the information bit portion H01 of the check matrix H0 are generated. Then a step type matrix is generated so that the weight number of each column, except for the last column, of a square matrix of m0 rows×m0 columns become 2, and this matrix is regarded as the parity bit portion H02 of the check matrix H0. By this, the check matrix H0 of the code C0 can be generated from the check matrix H1 of the code C1. In the vector addition, P+P=P', and if the shift numbers of the two cyclic matrices P at the left hand side are the same, then P'=0, and if the shift numbers of the two cyclic matrices P are different, then P' is not 0.

(F) Sixth Embodiment

In the H-ARQ retransmission method, the transmission side encodes and transmits information bits, and the receive side receives these codes, and if the information cannot be correctly decoded from the received codes, the receive side request a retransmission to the transmission side, and stores the received codes, and combines the retransmitted codes sent form the transmission side, with the stored codes, and performs decoding processing on the combined result to decode the information. In a communication system which uses the H-ARQ retransmission method, a transmitter controls retransmission by generating rate-compatible IRA codes C0, C1, C2, ..., using check matrices H0, H1, H2, .... The check matrix H0 has been optimized, and the check matrices H1, H2, ... are generated using the check matrix H0 according to the methods described in the first to third embodiments.

Figure 9:
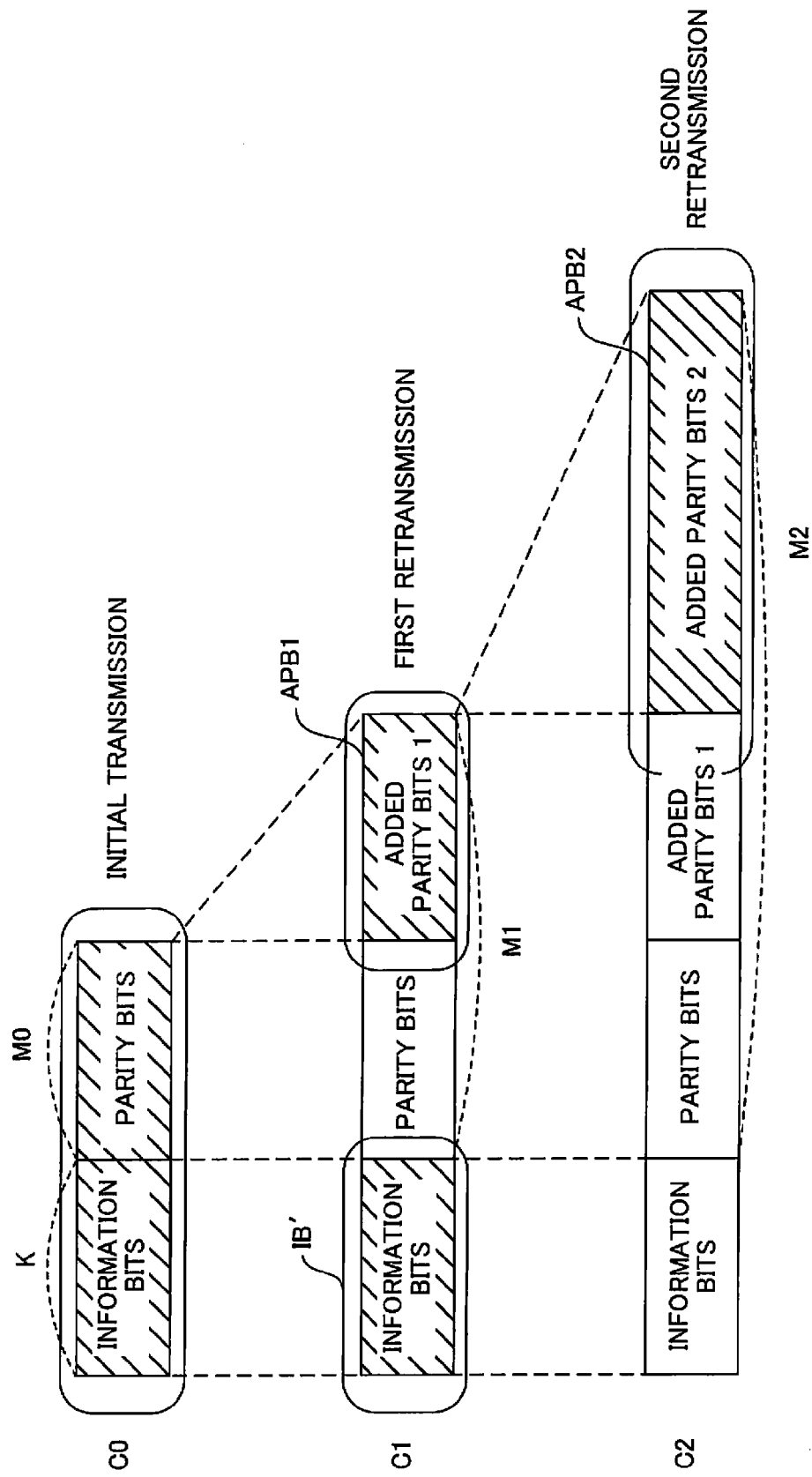
FIG. 9 is a diagram depicting a retransmission control in the sixth embodiment.

FIG. 9 is a diagram depicting the retransmission control according to the sixth embodiment. In the initial data transmission, the transmitter generates LDPC code C0, which is an IRA code, using the check matrix H0, and sends this code. The receiver performs decoding processing using the check matrix H0, and requests retransmission to the transmitter if the data cannot be decoded correctly. When a retransmission is requested, the transmitter generates the check matrix H1 using the check matrix H0, generates the LDPC code C1, which is an IRA code, using this check matrix H1, combines all the bits, not included in the code C0, out of the code C1 (added parity bits ABP1) and a part IB' of the code C0 having a size according to the difference between the number of the added parity bits ABP1 and the number of transmittable bits, and retransmits the result. The receiver combines the already received LDPC code C0 and the retransmitted LDPC code C1, and decodes the information bit using the check matrix H1. Retransmission ends if the information bits can be correctly decoded, but if not, the receiver requests retransmission to the transmitter. When a retransmission is requested, the transmitter generates the check matrix H2 using the check matrix H0, generates the LDPC code C2, which is an IRA code, using this check matrix H2, combines all the bits, not included in the code C1, out of the code C2 (added parity bits APB2), and a part of the code C1 having a size according to the difference between the number of the added parity bits APB2 and the number of transmittable bits (not exist in FIG. 9), and hereafter retransmission control is performed up to a predetermined number of times.

Figure 10:
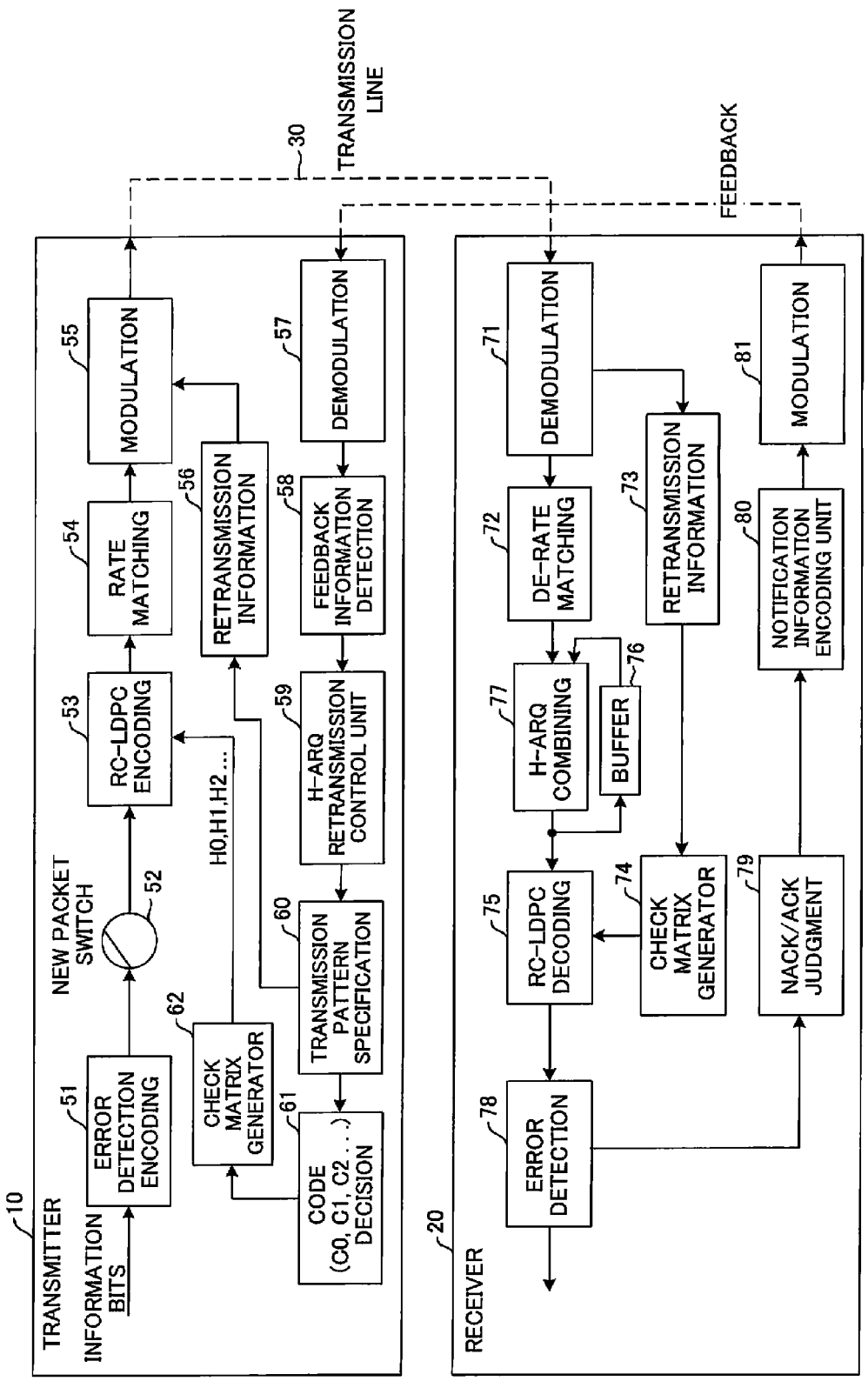
FIG. 10 is a block diagram depicting a communication system having a retransmission control function of the present invention.

FIG. 10 is a block diagram depicting a communication system having a retransmission control function of the present invention.

In a transmitter 10, an error detection encoding unit 51 attaches a CRC error detection code to the information bits to be transmitted, and a new packet switch unit 52 inputs the information bits to which the error detection code is attached at the initial transmission to an RC-LDPC encoder 53. The RC-LDPC encoder 53 generates a rate-compatible LDPC code (IRA code) using the check matrix H0, and outputs this code. A rate matching unit 54 performs rate matching processing, such as puncturing processing, so as to become a specified encoding ratio, and inputs the result to a modulation unit 55.

A retransmission information output unit 56 inputs retransmission information (initial transmission/first retransmission/second retransmission, retransmission pattern information for retransmission) to the modulation unit 55. The modulation unit 55 performs predetermined data modulation on the rate matched data and retransmission information, and the transmission unit, which is not shown in FIG. 10, converts the frequency of the modulated signal into a radio frequency, amplifies it to a high frequency, and sends the signal.

Figure 11:
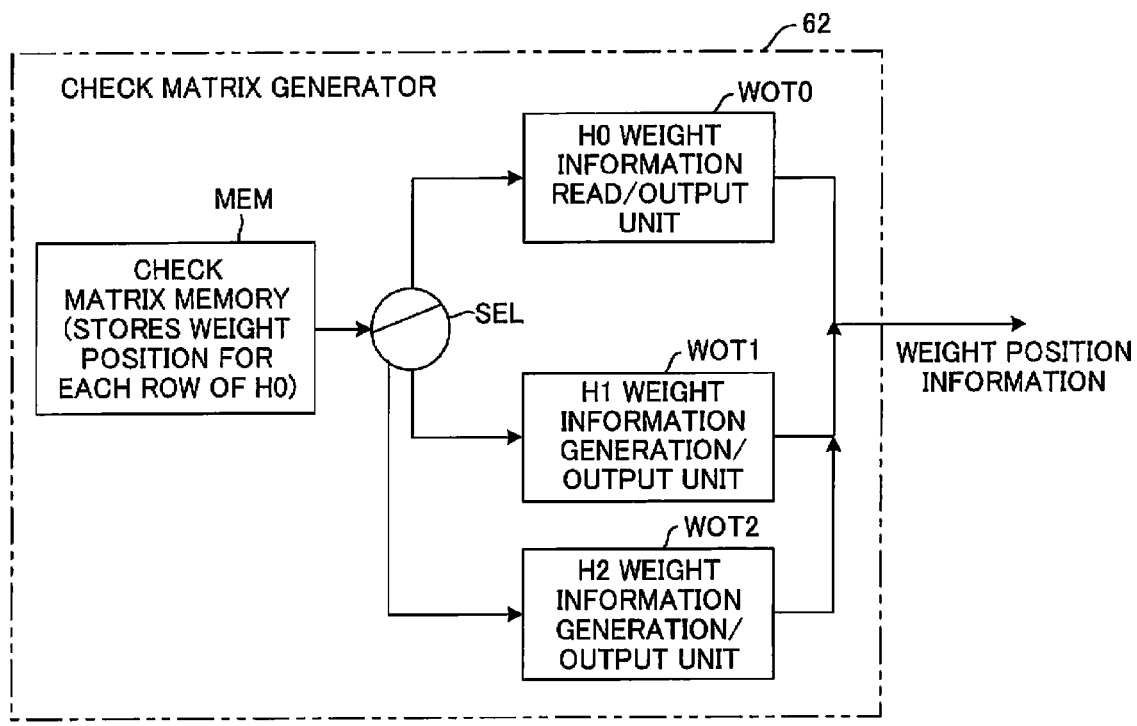
FIG. 11 is a block diagram depicting a check matrix generator.

A receiver 20 judges whether the information of the received packet was correctly decoded, as mentioned later, and notifies the success/failure of reception (ACK/NACK) to the transmitter 10. The receive unit (not shown in FIG. 10) of the transmitter 10 converts the frequency of the radio signal received from the receiver 20 into a base band signal, a demodulation unit 57 demodulates the received signal, a feedback information detection unit 58 judges ACK/NACK, and a H-ARQ control unit 59 instructs a retransmission and retransmission count to a transmission pattern specification unit 60 if NACK, or instructs the new packet switch 52 to send a new information block if ACK. If retransmission is instructed, the transmission pattern specification unit 60 notifies the retransmission pattern information (information for specifying the transmission data portion indicated by diagonal lines in FIG. 9) to the retransmission information output unit 56 based on the retransmission count, and inputs the retransmission count to a code decision unit 61. The code decision unit 61 judges the type of code (C0, C1, C2, ... ) generated based on the retransmission count, instructs the check matrix generation unit 62 to generate a check matrix according to the code to be generated, and the check matrix generator 62 generates the instructed check matrix and inputs it to the RC-LDPC encoder 53. FIG. 11 is a block diagram of the check matrix generator 62, where weight position (position of element 1) for each row of the check matrix H0 is stored in a memory MEM. In the case of generating the code C0, a selector SEL inputs the weight information on the check matrix H0, which was read from the memory MEM, to a H0 weight information output unit W0T0, and the H0 weight information output unit W0T0 inputs this weight information on H0 to the RC-LDPC encoder 53. In the case of generating the code C1, the selector SEL inputs the weight information on the check matrix H0 read from the MEM, to a H1 weight information generation/output unit W0T1, and the H1 weight information generation/output unit W0T1 generates a check matrix H1 of the code C1 by the method described in the first to third embodiments, and inputs the weight information to the RC-LDPC encoder 53. In the case of generating the code C2, the selector SEL inputs the weight information on the check matrix H0, read from MEM, to a H2 weight information generation/output unit W0T2, and the H2 weight information generation/output unit W0T2 generates a check matrix H2 of the code C2 by the method described in the first to third embodiments, and inputs the weight information to the RC-LDPC encoder 53. The RC-LDPC encoder 53 generates the rate-compatible LDPC codes (IRA codes) C0, C1, C2, . . . using the check matrix which was input, and outputs the data portion to be sent, as shown in FIG. 9.

In the receiver 20, the receive unit (not shown in FIG. 10) converts the frequency of the radio signal from the transmitter into a base band signal, a demodulation unit 71 performs demodulation processing and inputs a code portion out of the demodulated data to a de-rate matching unit 72, and inputs a retransmitted information portion to a retransmission information generation unit 73. The retransmission information generation unit 73 extracts a retransmission count from the retransmitted information, and inputs it to a check matrix generator 74, and the check matrix generator 74 generates a check matrix according to the retransmission count, and inputs it to an RC-LDPC decoder 75.

The de-rate matching unit 72 performs processing the opposite of the rate-matching processing performed by the transmission side (e.g. punctured decoding processing). An H-ARQ buffer unit 76 stores data of which decoding is failed in the previous reception, and an H-ARQ combining unit 77 combines the data stored in the H-ARQ buffer unit 76 and the retransmitted data received this time. For combining the data, diversity combining such as maximum ratio combining, which combines the corresponding bit values of the stored data and the newly received data, is performed. If only a value of one side exists as the corresponding bit, this bit at one side is output as is. For the combined data which is output from the H-ARQ combining unit 77, the RC-LDPC decoder 75 performs LDPC decoding processing using the check matrix which is input from the check matrix generator 74, and inputs the decoded result to an error detection unit 78.

The error detection unit 78 performs error detection processing on the decoded data, and checks whether the data was decoded correctly, and inputs the error detection result to a NACK/ACK judgment unit 79. If the data was correctly decoded, the error detection unit 78 outputs the decoded result and clear the data stored in the H-ARQ buffer 76, and if the data was not decoded correctly, the error detection unit 78 updates the content of the H-ARQ buffer 76 by the H-ARQ combining data.

The NACK/ACK judgment unit 79 instructs a notification information encoding unit 80 which one of NACK/ACK is sent to the transmitter 10 based on the error detection result, the notification information encoding unit 80 encodes the notification information according to this instruction, and a modulation unit 81 modulates the NACK/ACK notification information, and sends the result to the transmitter 10 via the transmitting unit (not shown in FIG. 10).

Figure 12:
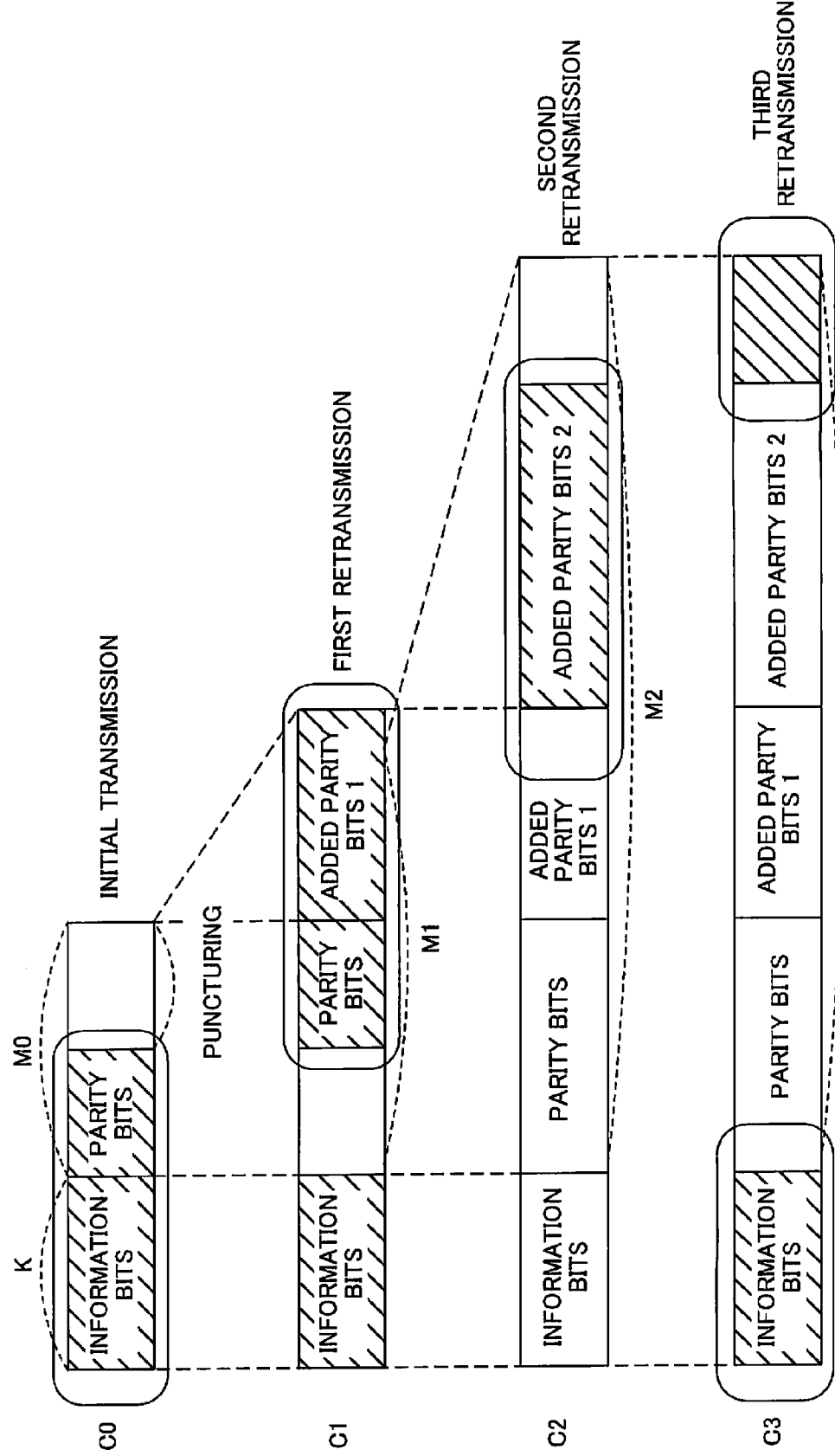
FIG. 12 is another diagram depicting retransmission control.
Figure 13:
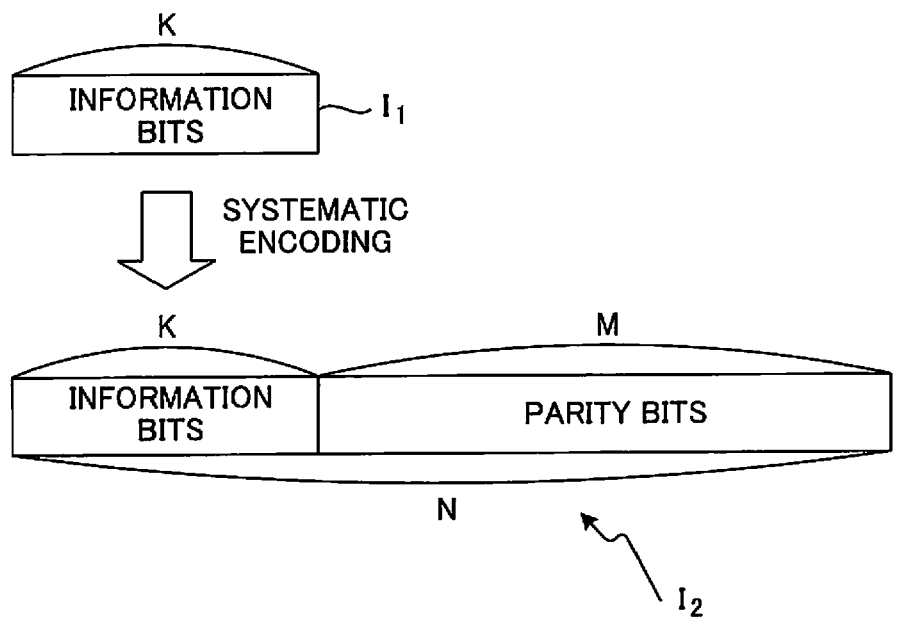
FIG. 13 is a diagram depicting a configuration of a systematic code.
Figure 14:
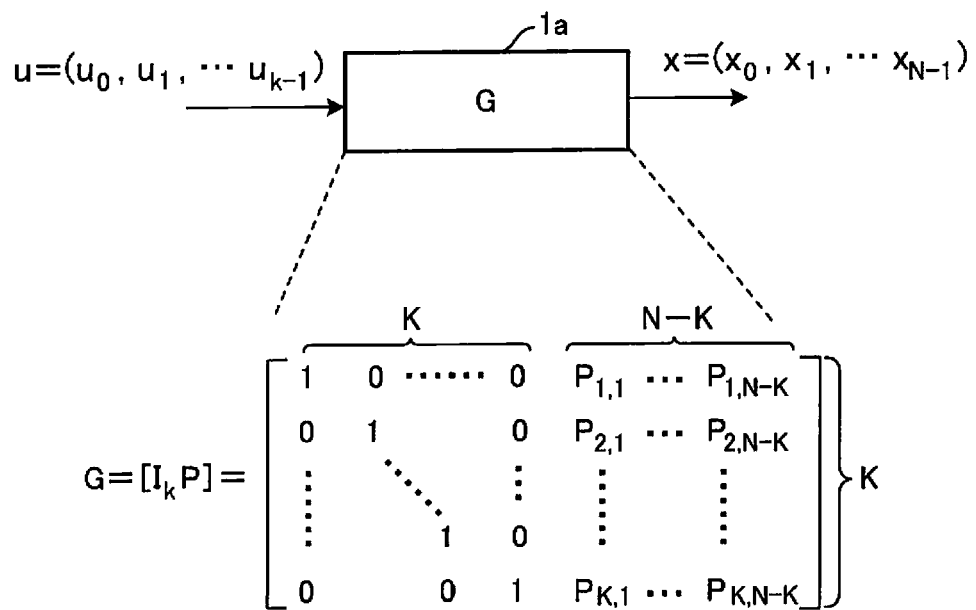
FIG. 14 is a diagram depicting a generator matrix G.
Figure 15:
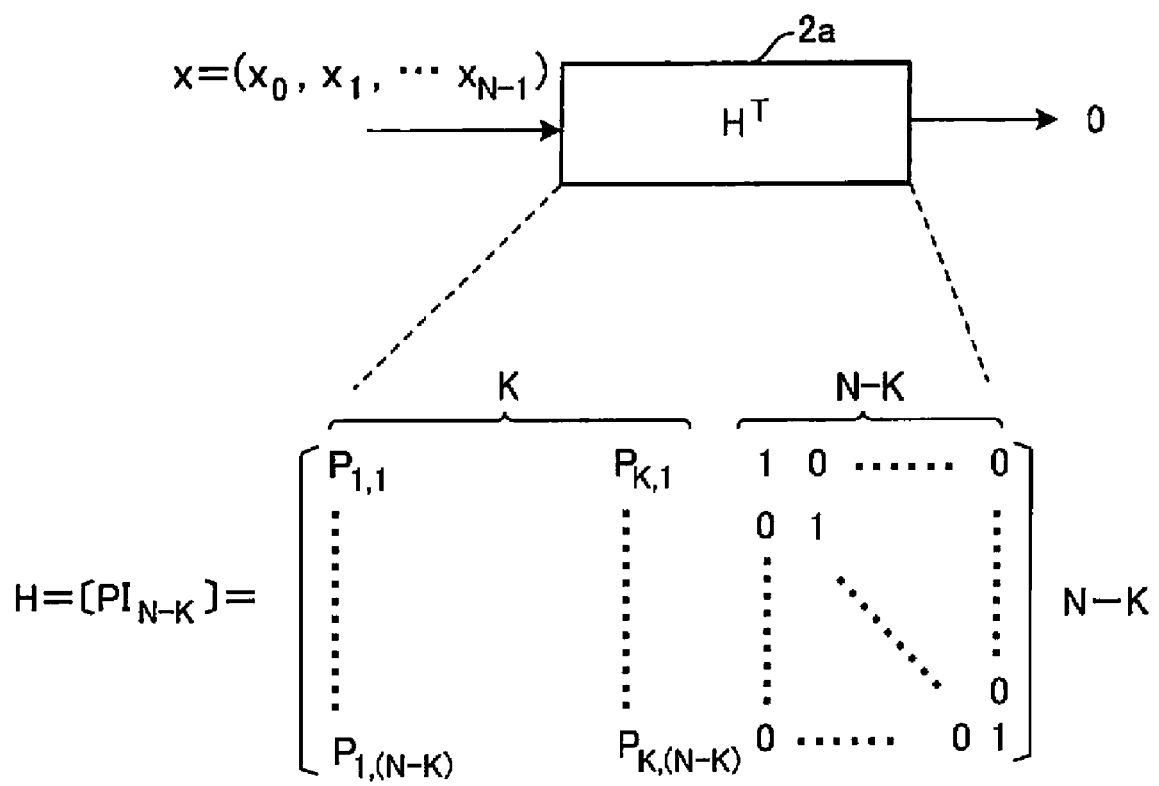
FIG. 15 is a diagram depicting a check matrix H.
Figure 16:
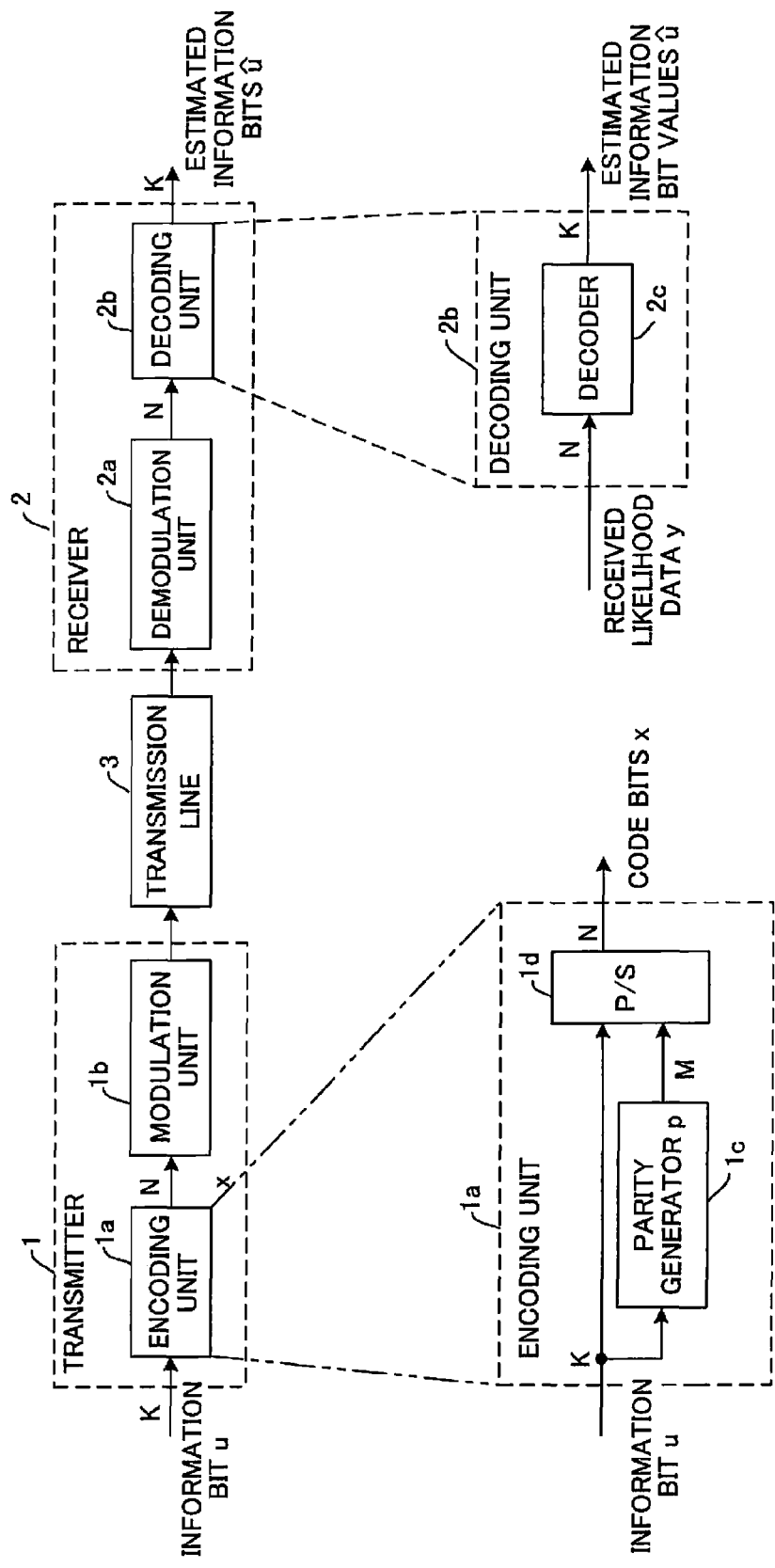
FIG. 16 is a block diagram depicting a conventional communication system, in which a transmitter block-encodes and a receiver decodes data.
Figure 18:
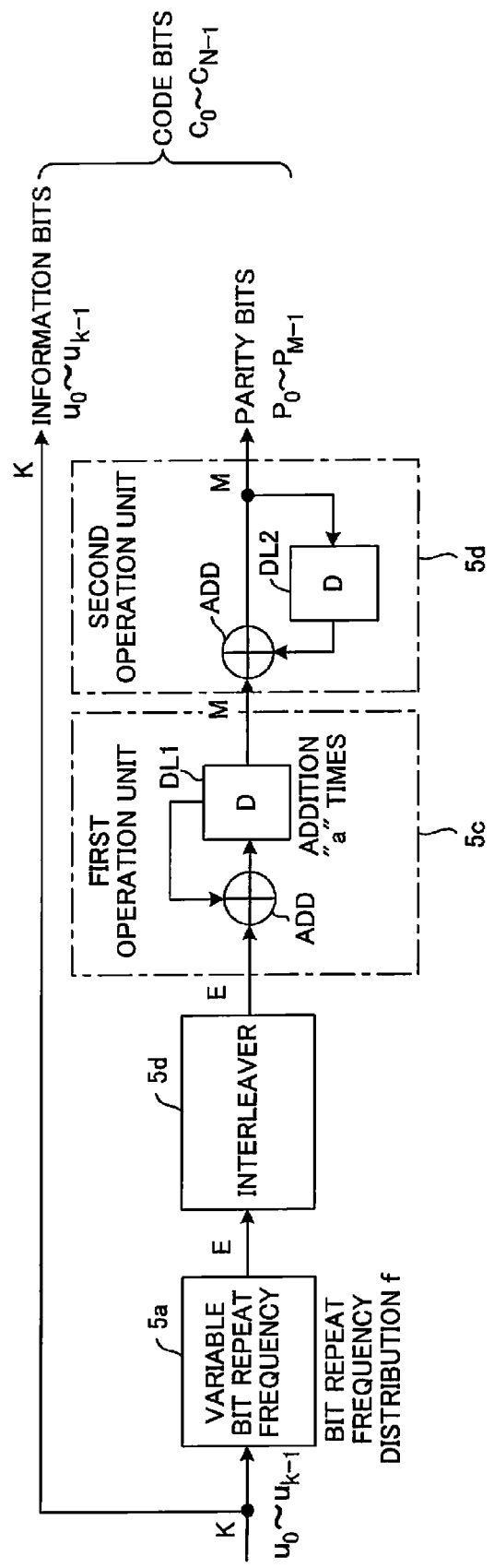
FIG. 18 is a block diagram depicting an encoder for generating IRA (Irregular Repeat Accumulate) code, which is a kind of irregular LDPC code.
Figure 19:
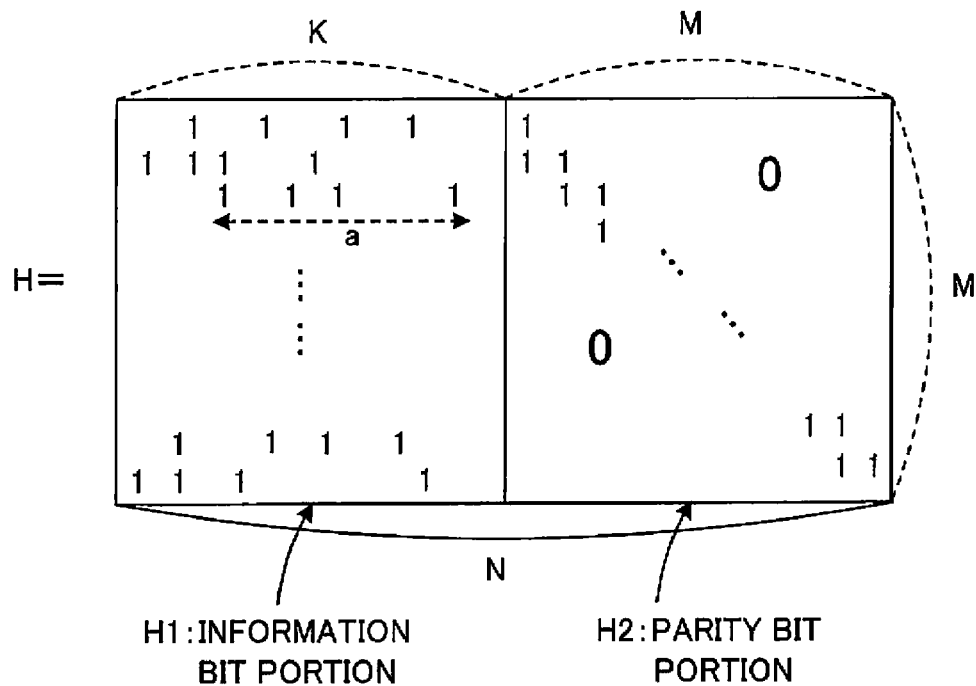
FIG. 19 is a diagram depicting a check matrix of an IRA code.
Figure 20:
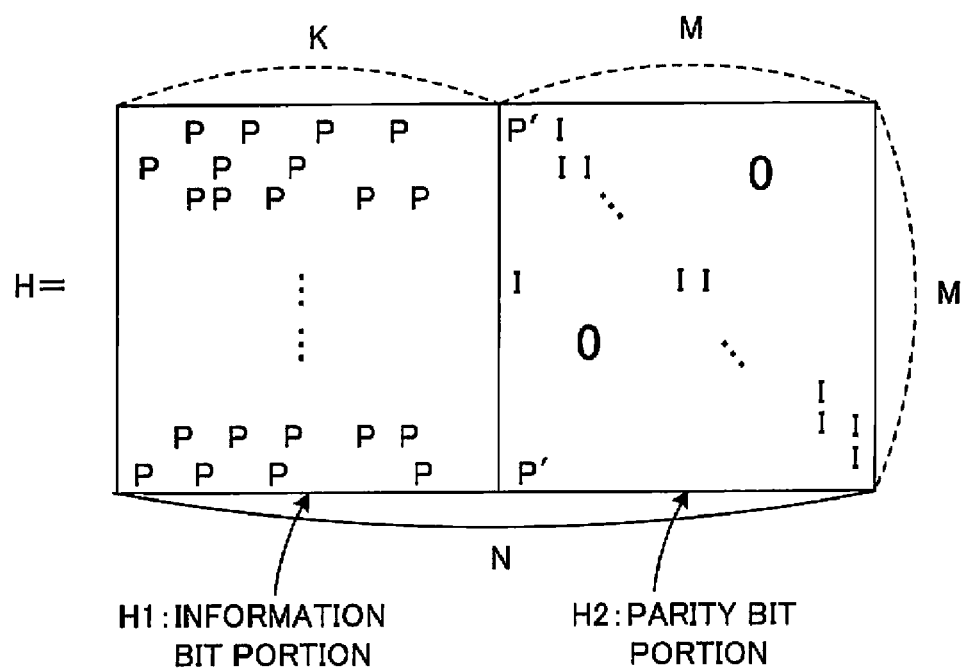
FIG. 20 is a diagram depicting a check matrix constructed using z×z cyclic matrix P(j)

FIG. 12 is another diagram depicting the retransmission control, and shows an example of the case of transmitting data by puncturing. In the initial data transmission, the transmitter generates LDPC code C0, which is an IRA code, using the check matrix H0, and punctures the difference of the number of bits of the LDPC code C0 and the actual number of transmittable bits and send the punctured data.

The receiver performs decoding processing using the check matrix H0, and if the data cannot be correctly decoded, that is if the packet was not correctly received, the receiver requests retransmission to the transmitter. By the retransmission request, the transmitter generates the check matrix H1 using the check matrix H0, generates the LDPC code C1, which is an IRA code, using this check matrix H1, combines the portion of code C0 which was not sent previously and the portion not included in the code C0, out of the code C1 (added parity bits 1), and retransmits the result.

The receiver combines the already received LDPC code portion and the retransmitted LDPC code portion, and decodes the information bits using the check matrix H1. Retransmission ends if the information bits can be correctly decoded, but if not, the receiver request a retransmission to the receiver. When the retransmission is requested, the transmitter generates the check matrix H2 using the check matrix H0, generates the LDPC code C2, which is an IRA code, using this check matrix H2, and retransmits the retransmittable additional parity bits 2, not included in the code C1, out of the code C2, and a similar retransmission control is performed up to a predetermined number of times.

According to the sixth embodiment, in the retransmission control based on the IR method, the check matrix H1, H2, . . . is generated from the check matrix H0 of the reference code C0, the code C1, C2, . . . is generated using the check matrix H1, H2, . . . , and the code C1, C2, . . . is punctured and retransmitted. Therefore a code acquired by applying puncturing can be characteristically optimized.

Effect of the Invention

According to the present invention, optimum weight distributions can be implemented simultaneously for both the reference code C0 and the code C1 after extension, wherein C0 and C1 are two LDPC systematic codes having encoding ratios R0 and R1 in a rate-compatible relationship, and the check matrix H1 of the code C1 is generated from the check matrix H0 of the reference code C0.

According to the present invention, the check matrix H1 of the code C1 can be generated from the check matrix H0 of the reference code C0 using a simple processing, without requiring a large size memory.

According to the present invention, codes acquired by puncturing in a retransmission control based on the IR method can be characteristically optimized.

What is claimed is:

1. An LDPC check matrix generation method in a communication system for generating a check matrix H1 of a code C1 from a check matrix H0 of a code C0, where the codes C0 and C1 are LDPC systematic codes having different encoding ratios in a rate-compatible relationship, and information bit sizes of the systematic codes C0 and C1 are K respectively, and parity bit sizes thereof are M0 and M1 (M0<M1, M1−M0=L) respectively, the method comprising:

selecting L number of rows out of the check matrix H0;

separating an information bit portion and a parity bit portion constituting each of the selected rows into two respectively, such that each of the separated information bit portions includes one or more non-zero elements which are "elements different from 0";

creating a new first row by coupling one separated information bit portion and one separated parity bit portion and creating a new second row by coupling another separated information bit portion and another separated parity portion; and generating, in a check matrix generator, the check matrix H1 of the systematic code C1 by placing the new first and second rows in place of each of the selected L number of rows in the check matrix H0.

2. The LDPC check matrix generation method according to claim 1, wherein when the separated information bit portions are IB1 and IB2, and the separated parity bit portions are PB1 and BP2, the new first and second rows are created by a combination of IB1 and PB1 and a combination of IB2 and PB2 respectively, or the new first and second rows are generated by a combination of IB1 and PB2 and a combination of IB2 and PB1.

3. The LDPC check matrix generation method according to claim 1, further comprising:
placing the coupled information bit portions and the parity bit portions on the original positions in the new rows respectively;
placing "0" in a position where an element is not placed in the new rows;
determining in the parity bit portion a column whose elements in the new first and second rows are "$0_s$"; and
adding a new column next to said column and placing "1" at the first and second row positions of the added column.

4. An LDPC check matrix generation method in a communication system for generating a check matrix H1 of a code C1 from a check matrix H0 of a code C0, where the codes C0 and C1 are LDPC systematic codes having different encoding ratios in a rate-compatible relationship, and information bit sizes of the systematic codes C0 and C1 are K respectively, and parity bit sizes thereof are M0 and M1 (M0<M1) respectively, the method comprising ctcps of:
when the systematic code C0 is an IRA code, each row in an information bit portion of the check matrix H0 for the systematic code C0 has "a" number of non-zero elements which are "elements different from 0", and a quotient and a remainder when M1 is divided by M0 are m and r respectively,
(1) selecting r rows out of the information bit portion of the check matrix H0, separating "a" number of non-zero elements included in each row into (m+1) number of groups, and regarding the elements included in each group as continuous (m+1) number of row elements of the information bit portion in the check matrix H1;
(2) for each of (M0−r) rows other than the r rows in the information bit portion, separating "a" number of non-zero elements included in the row into m number of groups, and regarding elements included in each group as continuous m number of row elements of the information bit portion in the check matrix H1;
generating the information bit portion of the check matrix H1 by M1 number of rows generated by the processing of (1) and (2); and
generating, in a check matrix generator, a parity bit portion of the check matrix H1 by creating a step type matrix so that the number of zero elements of each column, excluding the last column, of a square matrix of M1 rows×M1 columns become 2.

5. The LDPC check matrix generation method according to claim 4, wherein when the "a" is not exactly divisible by (m+1) or m, the remainder elements are distributed to each group one by one.

6. The LDPC check matrix generation method according to claim 4, wherein when each elements of the check matrix H0 is comprised of a cyclic matrix of z rows×z columns, the grouping is performed by handling the cyclic matrix as a minimum unit.

7. An LDPC check matrix generation method in a communication system for generating a check matrix H0 of a code C0 from a check matrix H1 of a code C1, where the codes C0 and C1 are LDPC systematic codes having different encoding ratios in a rate-compatible relationship and information bit sizes of the systematic codes C0 and C1 are K respectively, and parity bit sizes thereof are M0 and M1 (M0<M1) respectively, the method comprising:
when the systematic codes C0 and C1 are IRA codes, each row in an information bit portion of the check matrix H1 for the systematic code C1 has "a" number of non-zero elements which are "elements different from 0", and a quotient and a remainder when M1 is divided by M0 are m and r respectively,
(1) selecting (m+1) rows continuously out of the information bit portion of the check matrix H1, generating one row in an information bit portion of the check matrix H0 by performing vector sum of the selected (m+1) rows, and generating r rows in the information bit portion of the check matrix H0 in the same manner,
(2) separating the remaining rows in the information bit portion of the check matrix H1 into (M0−r) number of groups each of which consists of m rows, and generating (M0−r) rows in the information bit portion of the check matrix H0 by performing vector sum of the m rows constituting each group; and
generating the information bit portion of the check matrix H0 by M0 number of rows generated by the processing of (1) and (2); and
generating, in a check matrix generator, a parity bit portion of the check matrix H0 by creating, a step type matrix so that the number of non-zero elements of each column, excluding the last column, of a square matrix of M0 rows×M0 columns become 2.

8. The LDPC check matrix generation method according to claim 7, wherein each elements of the check matrix H1 is comprises a cyclic matrix of z rows×z columns.

9. An LDPC code retransmission method using the LDPC check matrix generation method according to claim 1 for receiving, on a receive side, a code transmitted from a transmission side, and requesting retransmission to the transmission side and storing the received code if information cannot be correctly decoded from the received code, and combining a retransmitted code retransmitted from the transmission side with the stored code and decoding the combined code, the method comprising
transmitting code C0 from the transmission side transmits wherein C0, C1, C2, . . . are rate-compatible codes and H0, H1, H2, . . . are check matrices created by said LDPC check matrix generation method,
if the receive side fails in normal reception of the code C0, combining all the bits not included in the code C0, out of the code C1, with a part of the code C0 having a size according to the difference between the number of said bits and the number of transmittable bits, and retransmitting the result,
then if the receive side fails in normal reception of the code Ci, combining all the bits not included in the code Ci, out of the code Ci+1, with a part of the code Ci having a size according to the difference between the number of said bits and the number of transmittable bits and retransmitting the result; and
on the receive side performing decode procession sequentially using the generated check matrices H0, H1, H2, . . . .

10. The code retransmission method according to claim 9, wherein a prescribed encoding ratio is realized by puncturing, or repetition, or by dummy bit insertion.

11. An LDPC check matrix generator for generating a check matrix H1 of a code C1 from a check matrix H0 of a code C0, where the codes C0 and C1 are LDPC systematic codes having different encoding ratios in a rate-compatible relationship, and information bit sizes of the systematic codes C0 and C1 are K respectively, and parity bit sizes thereof are M0 and M1 (M0<M1, M1−M0=L) respectively, said LDPC check matrix generator, comprising:

a non-transitory storage unit for storing the check matrix H0;

a check matrix creation unit for creating and outputting the check matrix H1 from the check matrix H0; and a switching unit for reading and outputting the check matrix H0 from the non-transitory storage unit if the check matrix H0 is required, and outputting the check matrix H1 created by the check matrix creation unit if the check matrix H1 is required, wherein the check matrix creation unit selects L number of rows out of the check matrix H0, separates an information bit portion and a parity bit portion constituting each of the selected rows into two respectively, such that each of the separated information bit portions includes one or more non-zero elements which are "elements different from 0", creates a new first row by coupling one separated information bit portion and one separated parity bit portion and creates a new second row by coupling another separated information bit portion and another separated parity portion, and generates the check matrix H1 of the systematic code C1 by placing the new first and second rows in place of each of the selected L number of rows in the check matrix H0.

12. An LDPC check matrix generator for generating a check matrix H1 of a code C1 from a check matrix H0 of a code C0, where the codes C0 and C1 are LDPC systematic codes having different encoding ratios in a rate-compatible relationship, and information bit sizes of the systematic codes C0 and C1 are K respectively, and parity bit sizes thereof are M0 and M1 (M0<M1) respectively, said the LDPC check matrix generator, comprising:

a non-transitory storage unit for storing the check matrix H0;

a check matrix creation unit for creating and outputting the check matrix H1 from the check matrix H0; and a switching unit for reading and outputting the check matrix H0 from the non-transitory storage unit, if the check matrix H0 is required, and outputting the check matrix H1 created by the check matrix creation unit if the check matrix H1 is required, wherein when the systematic code C0 is an IRA code, and each row in an information bit portion of the check matrix H0 for the systematic code C0 has "a" number of non-zero elements which are "elements different from 0", and a quotient and a remainder when M1 is divided by M0 are m and r respectively, the check matrix creation unit (1) selects r rows out of the information bit portion of the check matrix H0, separates "a" number of non-zero elements included in each row into (m+1) number of groups, and regards the elements included in each group as continuous (m+1) number of row elements of the information bit portion in the check matrix H1, (2) for each of (M0−r) rows other than the r rows in the information bit portion, separates "a" number of non-zero elements included in the row into m number of groups, regards the elements included in each group as continuous m number of row elements of the information bit portion in the check matrix H1, and generates the information bit portion of the check matrix H1 by M1 number of rows generated by the processing of (1) and (2), and (3) generates a parity bit portion of the check matrix H1 by creating a step type matrix so that the number of non-zero elements of each column, excluding the last column of a square matrix of M1 rows×M1 columns, become 2.

13. A LDPC check matrix generator for generating a check matrix H0 of a code C0 from a check matrix H1 of a code C1, where the codes C0 and C1 are LDPC systematic codes having different encoding ratios in a rate-compatible relationship, and information bit sizes of the systematic codes C0 and C1 are K respectively, and parity bit sizes thereof are M0 and M1 (M0<M1) respectively, said LDPC check matrix generator, comprising:

a non-transitory storage unit for storing the check matrix H1;

a check matrix creation unit for creating and outputting the check matrix H0 from the check matrix H1; and a switching unit for reading and outputting the check matrix H1 from the non-transitory storage unit if the check matrix H1 is required, and outputting the check matrix H0 generated by the check matrix creation unit if the check matrix H0 is required, wherein when the systematic codes C0 and C1 are IRA codes, each row in an information bit portion of the check matrix H1 for the code C1 has "a" number of non-zero elements which are "elements different from 0", and a quotient and a remainder when M1 is divided by M0 are m and r respectively, the check matrix creation unit (1) selects (m+1) rows continuously out of the information bit portion of the check matrix H1, generates one row in an information bit portion of the check matrix H0 by performing vector sum of the selected (m+1) rows, and generates r rows of the information bit portion of the check matrix H0 in the same manner, (2) separates the remaining rows in the information bit portion of the check matrix H into (M0−r) number of groups each of which consists of m rows, generates (M0−r) rows in the information bit portion of the check matrix H0 by performing vector sum of the m rows constituting each group, and generates an information bit portion of the check matrix H0 by M0 number of rows generated by the processing of (1) and (2), and (3) generates a parity bit portion of the check matrix H0 by creating a step type matrix so that the number of non-zero elements of each column, excluding the last column of a square matrix of MO rows×M0 columns, become 2.

* * * * *